United States Patent [19]
Peterson et al.

[11] Patent Number: 5,241,546
[45] Date of Patent: Aug. 31, 1993

[54] ON-THE-FLY ERROR CORRECTION WITH EMBEDDED DIGITAL CONTROLLER

[75] Inventors: Bruce R. Peterson; Hung C. Nguyen; Michael G. Machado, all of San Jose, Calif.

[73] Assignee: Quantum Corporation, Milpitas, Calif.

[21] Appl. No.: 650,791

[22] Filed: Feb. 1, 1991

[51] Int. Cl.$^5$ .................... G06F 11/10; H03M 13/00
[52] U.S. Cl. .................. 371/37.1; 371/37.5; 371/38.1; 371/39.1
[58] Field of Search .......... 371/37.1, 38.1, 37.5, 371/39.1

[56] References Cited

U.S. PATENT DOCUMENTS

| | | | |
|---|---|---|---|
| 4,185,269 | 1/1980 | Hodges et al. | 340/146.1 AL |
| 4,413,339 | 11/1983 | Riggle et al. | 371/40.1 |
| 4,566,105 | 1/1986 | Oisel et al. | 371/37.5 |
| 4,567,594 | 1/1986 | Deodhar | 371/38 |
| 4,675,652 | 6/1987 | Machado | 360/40 |
| 4,730,321 | 3/1988 | Machado | 371/38 |
| 4,782,490 | 11/1988 | Tenengolts | 371/40 |
| 5,170,299 | 12/1992 | Moon | 360/51 |

OTHER PUBLICATIONS

NCR 85C20 Error Correcting Code Chip Data Sheet NCR Microelectronics, Division, Colorado Springs, Colo. Nov. 1987, pp. 1-59.

Bus Structured ECC Application Note, Rev. 1.3 Sep. 1, 1989 Everex Systems, Inc., Fremont, Calif. pp. 1-34.

*Primary Examiner*—Robert W. Beausoliel, Jr.
*Assistant Examiner*—Trinh L. Tu
*Attorney, Agent, or Firm*—David B. Harrison

[57] ABSTRACT

An on-the-fly error correction method and apparatus for correcting a data block within a stream of substantially contiguous data blocks during a data decoding process, each block having a Reed-Solomon error syndrome calculated and appended during an encoding process. The method comprises the steps of:

passing the block through a syndrome remainder recovery circuit to obtain a remainder related to the error syndrome, comparing the remainder with zero to determine if an error burst is present, and if an error burst is present:

latching the remainder into a remainder latch in order to free the syndrome information recovery circuit for the next data block of the stream, causing a multitasked microcontroller to call and execute an error correction service routine and thereupon selectively transferring the remainder from the remainder latch to the microcontroller, determining with the microcontroller the location and a corrected value for the error burst in accordance with a Reed Solomon error correction algorithm, and substituting the corrected value for the error burst within the block detected to contain the error burst before it is delivered to a host system. Cross checking the correction, and error detection of data block ID fields is also disclosed.

43 Claims, 9 Drawing Sheets

Microfiche Appendix Included
(28 Microfiche, 1 Pages)

ON-THE-FLY ERROR CORRECTION WITH EMBEDDED DIGITAL CONTROLLER

REFERENCE TO MICROFICHE APPENDIX

A microfiche appendix containing a firmware program listing comprises a part of the present disclosure and the disclosure thereof is incorporated herein by reference.

FIELD OF THE INVENTION

The present invention relates to methods and apparatus for detecting and correcting byte errors within a data stream. More particularly, the present invention relates to methods and apparatus for detecting and correcting byte errors within data blocks, such as data blocks read out from a storage surface within a rotating disk data storage subsystem, wherein the subsystem includes a programmed digital controller.

BACKGROUND OF THE INVENTION

Error correction techniques are known in digital data processing systems, including memory stores such as disk drive data storage subsystems and tape drive data storage subsystems, and they are known in digital data communications systems. A methodology is selected and implemented which generates syndrome information from substantially contiguous blocks, sets or subsets of a digital data stream. By "contiguous" is meant that the blocks occur one immediately after another, with minimum interval or time lapse between or separating the blocks. The syndrome information is appended to the block, set or subset at an encoder end, typically within a data writing or transmission process. At a data reading or reception process, the received error correction syndrome information, called herein the "remainder", is obtained from the received data block and compared with zero. If there are any non-zero remainder values or bytes, an error is determined to be present. Depending upon the nature and amount of appended syndrome information, it is possible to detect and correct one or more error bursts in the data block.

An error burst is a set of adjacent bit positions which are in error. A single error burst is one occurrence of such erroneous bit positions within a data block, and can extend over the interleaves thereof. A double error burst is two separate occurrences of error burst within the data block, for example. Error correction systems and strategies are typically rated upon their ability to locate and correct single burst and double burst errors, as well as the speed of execution and a low probability of miscorrection of error bursts by the error correction strategy.

In the prior art approach, a syndrome converter is typically implemented as a shift register with taps and with external multiplier elements. In an external form, a summer combined multiplier terms from the shift register with the incoming data stream in order to generate the syndrome. In commonly assigned U.S. Pat. No. 4,730,321, to Machado, the disclosure of which is hereby incorporated by reference, an internal form was used in which the shift register includes the summing nodes, in order to permit logical elements to be shared and thereby minimize the number of structural elements required to implement the error correction hardware.

Many error correction code schemes employed within disk drives have employed a Galois field of one bit [$GF(2^1)$]. In a one bit implementation, the multiplier terms are therefore either present or not present, and the summing node is implemented as an Exclusive OR gate. Several prior implementations have gone to a Galois Field byte basis (i.e., eight bits per symbol), as was done in the referenced U.S. Pat. No. 4,730,321 to Machado. In those prior approaches, the syndrome generator received eight bits in and put eight bits out. The referenced Machado '321 patent employed a Galois field in which the primitive element alpha[1] term is 2B (Hex) in order to reduce the number of gates needed to implement the syndrome generator circuitry.

The general problem with a classic error correction approach, whether bit/input to bit/output or a byte input/byte output, is that when one or more errors are detected within a particular block, the system data stream has to be shut down during the interval required to determine the location and correct the burst error or errors within the block determined to include the error.

Particularly in disk drive data storage subsystems, it is now commonplace to encounter one or more programmed monolithic digital microcontrollers. These microcontrol elements are very powerful in carrying out operations and calculations appropriate to supervise data transducer head positioning and track following operations, and to supervise transfers of data, commands and status values with the host computing system, on an as needed basis.

Since errors and consequent error correction processes occur relatively infrequently in well designed and manufactured disk drives, the calculational power of the microcontroller is best adapted to the task of performing error location and correction operations on an as-needed, interrupt basis. For example, if data blocks are being read from the disk surface, reading of subsequent blocks ceases during the error location and correction process. As was the case in the referenced Machado '321 patent, after the data stream is shut down, the disk drive microcontroller obtains the ECC remainder for the data block having the error. Based upon the remainder, the microcontroller then calculates values for locating and correcting the error. Erroneous data values are then replaced by corrected data values inserted in the data block in a buffer memory. After correction, the data block is then available to be sent out to the host computer, and at that point the data stream may be permitted to resume its flow of data blocks.

In summary, the prior approaches, whether bit-based or byte-based, perform three common functions: they read the incoming data and compare the recovered remainder values with zero. If there is an error, they shut down the data stream, then they may perform a retry by e.g. rereading the data and resending it through the syndrome generator in an attempt to eliminate non-repeating or "soft" errors. If that doesn't work, i.e., a hard data error is present, they then perform an error correction operation. If the operation is determined to be successful, the data stream is thereafter reinitiated. If the error is determined to be uncorrectable, an error message is sent to the host computing system or communications system, and data transfer process is stopped indefinitely.

There have been several prior efforts directed to performing very rapid error correction. One architecture, believed to be embodied in a special hardware chip having many thousands of gates, is described in U.S. Pat. No. 4,782,490 to Tenengolts, the disclosure of which is incorporated by reference. While Tenengolts speaks of embodiments employing both hardware and firmware to implement high speed error correction techniques, no practical guidance is provided for implementation of on-the-fly error correction. For example, in the Tenengolts patent FIG. 8 "error trapping" embodiment, the same shift register used to detect errors, is also used after an error is detected for the error trapping process, thereby removing the availability of the shift register for the next block of incoming data in real time.

As used herein, the expression "on-the-fly" means an error correction process which is carried out with minimized data flow interruption, and which does not require one or more disk rotation latencies (revolutions) for carrying out the correction process. In order to perform ECC "on-the-fly", it is necessary to detect and correct the data errors, and to do so in a manner which does not stop the flow of data blocks during a typical transfer of multiple blocks. Conventionally, these two requirements have heretofore been conceptually lumped together. Actually, the present inventors have discovered that these two requirements are separate and separable aspects to the overall problem of error correction.

A syndrome generator is typically provided within a hardware implementation for error correction. This syndrome generator operates on-the-fly upon the data stream in order to generate an ECC syndrome for each predetermined data block. Once the syndrome is generated, it is typically appended at the end of the data block during the recording/ECC encoding process.

As taught by the referenced Machado '321 patent, the syndrome generator circuitry may also be used as a remainder recovery circuit during data block readback from the storage surface. The syndrome remainder bytes regenerated during readback from the data block or subsets coming e.g. from the disk surface are compared to zero by a hardware comparator. If the remainder bytes are not zero, an error is present in the readback data block or interleave thereof. In the Machado '321 patent approach, the data stream is then stopped, and the non-zero remainder bytes held in the syndrome generator shift registers are then passed via a bus structure to the microcontroller. The microcontroller then executes firmware routines to locate and correct the error or errors. The prior Machado '321 patent approach, while employing the on-board digital microcontroller to carry out error correction processes, did not do so on-the-fly. Detection of any error caused data flow to stop.

Another typical approach to perform on-the-fly error correction has been to provide one or more dedicated hardware processors whose task it is to calculate the correction of errors and to insert corrected data for erroneous data into one or more appropriate positions of the data block undergoing correction. Typically associated with dedicated hardware processors is a dedicated FIFO or buffer memory, typically four kilobits in storage capacity (512 bytes by 8 bits per byte).

An example of a hardware-based ECC architecture is given in the referenced Tenengolts U.S. Pat. No. 4,782,490. As best understood, Tenengolts provides a very general approach to error correction and cross checking in conjunction with FIG. 2, and no mention or discussion is provided concerning error correction on the fly. However, in conjunction with his FIG. 8 embodiment, the syndrome that detected the burst error is shifted through the original ECC recovery circuit's shift registers until the error is located. The number of serial shifts required until zero value residue bytes are encountered is counted. This count then provides the error burst location, while residue bytes immediately following the zero byte residue bytes provide a basis for determining the corrected data values to be inserted in the data stream. While Tenengolts proposes clocking the ECC shift registers at a four-times clock rate to permit "a single burst correction to be performed in the record transfer time" (Tenengolts Column 15, lines 47-48), it is not clear how such a procedure would enable the next contiguous block of data to be passed through the shift registers in real time (i.e. on-the-fly), unless considerable gaps existed between the data blocks, or a block transfer delay was actually programmed into the data stream with a FIFO block buffer, etc. While the Tenengolts FIG. 2 approach is stated to be very fast, it is also admittedly complex. The FIG. 8 approach is said to be slower, but sufficiently fast, even though the decoding process is said to be implemented in firmware. While a firmware implementation is mentioned, no details, such as a firmware code listing, are given in the Tenengolts patent. The Tenengolts patent also describes cross checking and ID field (header) error detecting techniques within the constraints of the hardware implementation given in FIG. 2, for example.

Another high speed ECC architecture, involving dedicated parallel processors operating in pipeline manner to avoid inter-step transfers is described in U.S. Pat. No. 4,567,594 to Deodhar, the disclosure of which is also incorporated by reference. The technique described in Deodhar U.S. Patent No. divides the Reed-Solomon decoding process into a sequence of steps which are carried out by the pipeline dedicated processors with a minimum of inter-step parameter transfers.

A more enlightened prior art approach to error correction makes use of the data block buffer associated with the data controller function. This approach uses a DMA channel in order to access and control the data block buffer. The ECC hardware generates a DMA request to the block buffer thereby to gain access to the erroneous data cells which are to be corrected. This approach recognizes the advantage of using the already existent data block buffer memory for the error correction process. This is the approach followed in the referenced, commonly assigned U.S. Pat. No. 4,730,321 to Machado. However, this prior approach did not achieve "on-the-fly" error correction.

In addition to the inability to perform single burst error correction on-the-fly, another drawback of the approach described in the referenced Machado '321 patent arises from the probability of misdetection and consequent miscorrection of data in the double burst correction mode, essentially limiting its utility to single burst correction. While the occurrence of random errors within the correction capability of a particular Reed Solomon error correction algorithm will result in a zero miscorrection probability, if the number of random errors exceeds that correction capability, the miscorrection probability becomes quite high, approximately 0.233. This means that almost one quarter of the errors statistically occurring above the correction capability will be misdetected and miscorrected. Known prior techniques which have been employed to reduce the misdetection probability have included cross checks, such as including check sums within the data block. However, such cross checks have not been particularly powerful, nor have they been able to detect shuffling or rearrangement of data values within the data block.

SUMMARY OF THE INVENTION WITH OBJECTS

A general object of the present invention is to provide "on the fly" error correction upon blocks of data within a sequence of data blocks by operatively combining a hardware-reduced ECC syndrome generator circuit including a remainder latch, and an embedded digital microcontroller and block buffer in a manner which overcomes limitations and drawbacks of the prior art.

Another general object of the present invention is to realize a practical hardware-minimized implementation of "on the fly" error correction within a digital data system in which the correction processes are carried out substantially within drive-resident firmware executed as needed by an embedded microcontroller supervisor as a background operation and without interrupting the flow of data.

Another general object of the present invention is to provide an ECC syndrome remainder recovery circuit which includes a latch for selectively latching ECC syndrome remainders not equaling zero, thereby enabling on-the-fly error correction to be carried out by a microcontroller and block buffer memory without stopping flow of data blocks within a digital data system.

Another general object of the present invention is to provide a Reed Solomon cross check polynomial for use to check the correctability of error bursts in a data block by a Reed Solomon error correction polynomial, wherein both the cross check polynomial and the error correction polynomial are based upon a Galois field in which a primitive element alpha$^1$ term is not equal to 02 (Hex).

A more specific object of the present invention is to provide a Reed Solomon cross check polynomial employing a primitive element alpha$^1$ term having a 2B(HEX) value.

A more specific object of the present invention is to provide an on-the-fly error correction system within a disk drive data storage subsystem including a supervisor microprocessor which determines error location and values within error bursts determined to be present from latched non-zero syndrome remainder bytes as a background operation, not usually requiring interruption of flow of data blocks from the disk to a host computing system.

Yet another more specific object of the present invention is to provide an error correction method which includes on-the-fly cross checking in order to determine correctability and thereby reduce the possibility of miscorrection of a detected error burst in a data block.

A still further more specific object of the present invention is to provide a hardware-minimized error correction/error detection syndrome generator apparatus which may be minimally modified in order to perform either two byte or three byte real time error detection for data block ID fields (headers), as well as recover remainders for error correction of data blocks.

One more specific object of the present invention is to provide a Reed Solomon based ID field error detection method and apparatus which employs a Galois Field generator polynomial with non-consecutive roots in order to minimize hardware requirements without compromising integrity of the error detection process.

One more specific object of the present invention is to provide methods and structure for carrying out cross checking of the error correction process while minimizing the amount of additional hardware required to perform cross checking.

Yet a further specific object of the present invention is to provide a data block ID field error detection process which employs the same multiplier terms as are employed within an error correction process for the identified data block, thereby enabling use of common multiplier circuitry for both the ID field error detection and the data block error correction processes.

Still one more specific object of the present invention is to provide an optimized, flexible hardware/firmware system which performs error correction and cross checking of data blocks and error detection of ID fields in real time and without data flow interruption, at least in the instance of single burst errors.

In accordance with principles of the present invention, an on-the-fly error correction method corrects a data block of a stream within a data decoding process. Each block has ECC syndrome information calculated and appended in accordance with a predetermined Reed Solomon code during an encoding process occurring before the data decoding process. The correction method occurring during the decoding process comprises the steps of:

passing the block of data through a syndrome information recovery circuit to obtain remainder information related to the error syndrome information, comparing the remainder information with zero to determine if an error burst is present within the data block, and if an error is determined to be present:

latching the recovered information into a remainder latch in order to free the syndrome information recovery circuit for the next data block of the stream, transferring the recovered information from the remainder latch to a microcontroller and causing it to execute an error correction service routine, determining the location and a corrected value for the error burst or bursts with the microcontroller in accordance with a predetermined Reed Solomon error correction algorithm, and substituting the corrected value for the error burst within the block that was detected to contain the error burst.

As one facet of the inventive method the data block further includes Reed Solomon cross check information calculated and appended thereto during the encoding process, and the method further comprises the steps of latching recovered cross check syndrome information into the syndrome latch and determining with the microcontroller the effect of the corrected value upon the recovered cross check syndrome information in order to detect possible miscorrection.

As another facet of the inventive method, the data block includes at least one ID field including Reed Solomon ID field error detection information employing the same multiplier terms as are employed for error correction, thereby enabling the syndrome information recovery circuit to detect errors in a said data block ID field.

Further in accordance with the present invention, a Reed-Solomon error correction code syndrome generator apparatus is provided for use in a data block transfer path within a computing system, such as within a fixed disk drive data storage subsystem. Each substantially contiguous data block being transferred includes Reed Solomon error correction coding syndrome information appended at the end thereof for enabling detection and correction of errors within data of the block. Each data block further includes Reed-Solomon cross checking syndrome information appended to each data block in a manner such that the error correction coding syndrome information is derived further in relation to the cross checking syndrome information of the block. During an encoding process an error correction code syndrome generator calculates error correction coding syndrome information in accordance with a Galois finite field ($2^8$) generated by a field generator polynomial having the form $x^8+x^4+x^3+x^2+1$ and wherein the first term of the field is $x^5+x^3+x+1$ (which is 00101011 binary), each error correction syndrome being of the form $G(x)=x^4+(alpha^{18}).x^3+(alpha^{87}).x^2+(alpha^{18}).x^1+1$. During the encoding process, a cross check syndrome generator calculates cross checking syndrome information having the form $G(x)=x^2+alpha^1$. The error correction coding syndrome information and the cross checking syndrome information are then appended to each data block.

During a decoding process, the Reed-Solomon error correction code syndrome generator apparatus operates as a remainder recovery circuit to obtain a syndrome remainder from a data block passing therethrough. The syndrome remainder is related to the error correction syndrome such that an error burst location and correction value may be determined for the data block. The generator apparatus compares the remainder to zero. If the syndrome remainder is non-zero, the remainder is latched in a remainder latch, together with a cross check syndrome remainder which is related to the cross checking syndrome. A programmed digital microcontroller then determines from the latched remainder the error burst location and a corrected value and checks the impact of the corrected value upon the latched cross check remainder. The microcontroller then causes the corrected value, if determined not to be a miscorrection, to be substituted for the error burst within the data block.

In one aspect of this facet of the present invention, the cross check syndrome generator comprises an input for receiving each incoming data block as a clocked data stream of serial bytes, a first summing junction for summing each byte of the incoming data block clocked data stream with a feedback byte to produce a sum byte, a multiplier for multiplying the sum byte by $alpha^1$ to yield a first product byte, a first clocked latch stage connected to the multiplier for storing the first product byte during a first byte clock period and for storing subsequent product bytes during subsequent byte clock periods, and a second clocked latch stage connected to the first clocked latch stage for storing the first product byte during a second byte clock period, the second clocked latch stage for feeding back the first product byte during the second byte clock period as the feedback byte to the summing junction.

In another aspect of this facet of the present invention, the Reed-Solomon error correction code syndrome generator apparatus described above further comprises error detection circuitry for generating in real time an error detection syndrome for a data ID field of the data block.

These and other objects, aspects, advantages and features of the present invention will be more fully understood and appreciated by those skilled in the art upon consideration of the following detailed description of a preferred embodiment, presented in conjunction with the accompanying drawings.

DETAILED DESCRIPTION OF A PREFERRED EMBODIMENT

While the present invention is effectively embodied in any system transferring blocks of data, whether storage or communication, it finds particular utility and efficiency in the field of data storage and retrieval, such as within a fixed disk data storage subsystem. In such a system, to be described in greater detail hereinafter, data blocks are stored as data fields or data sectors within concentric data storage track locations of one or more data storage disks. As used herein, the terms data block, data field and data sector are used substantially interchangeably. A data read/write transducer is selectively positioned over the track location of interest, and blocks are written to or read from data sector storage locations within the track location. It is the process of storing and retrieving blocks of data, for example, which gives rise to the need for error correction, cross checking, and ID field error detection techniques of the present invention.

Figure 1:
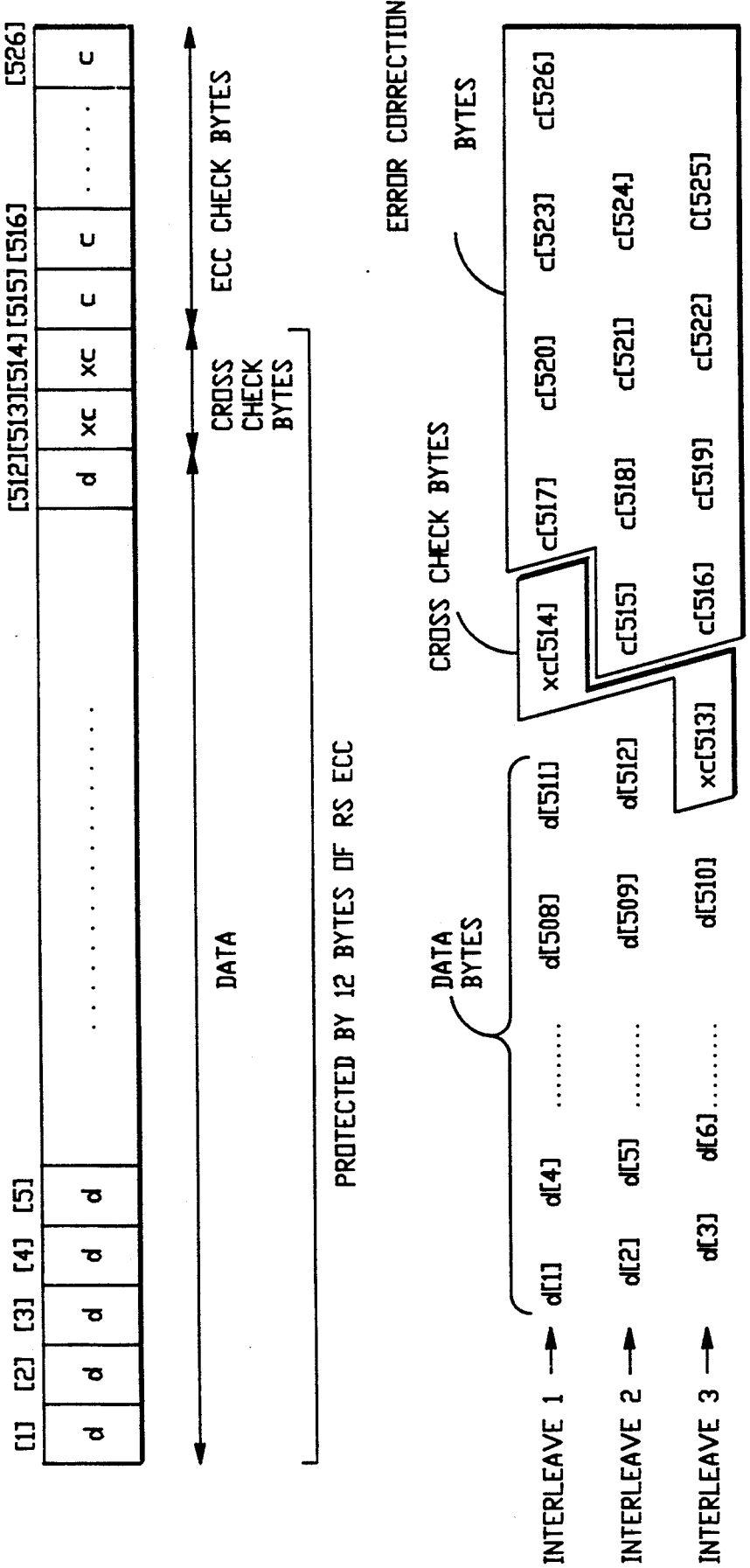
FIG. 1 is a schematic graph of a 512 byte data field for use with the methods and apparatus of the present invention wherein the data field is arranged into three interleaves and to which two cross check bytes, and twelve error correction bytes have been appended.

An exemplary data block or field found within a fixed disk data storage subsystem, for example, is set forth in FIG. 1. There are 512 data bytes designated [1] through [512]. Bytes [513] and [514] comprise two cross check bytes for cross checking the data bytes [1] through [512], and there are twelve ECC bytes [515] through [526] which are used for error correction of the data bytes and cross check bytes. As illustrated in the lower portion of FIG. 1, in this particular disk drive data block example there are three interleaves: interleave 1, interleave 2 and interleave 3. Interleave 1 contains bytes [1], [4], [7], [10], etc. Interleave 2 contains bytes [2], [5], [8], [11], etc. Interleave 3 contains bytes [3], [6], [9], [12], etc. Interleaves 1 and 2 each include a total of 171 data bytes, and interleave 3 contains 170 data bytes. As is apparent from FIG. 1, the two cross-check byte positions [513] and [514] are located in different interleaves, and there are four ECC bytes located in each interleave: bytes [517], [520], [523] and [526] in Interleave 1, bytes [515], [518], [521] and [524] in Interleave 2, and bytes [516], [519], [522], and [525] in Interleave 3. The use of within-sector interleaves is conventional in error correction schemes in order to extend the ECC capability to longer error burst lengths. Another reason is to spread a contiguous block error burst across several interleaves, thereby reducing the complexity of error correction techniques, for example.

In the presently preferred error correction example, a single error burst is defined as an error occurring in one byte within one of the interleaves. A double burst error is defined as an error occurring in two bytes within one of the interleaves. Given the three interleaves depicted in FIG. 1, it is apparent that a single burst error may be up to three bytes in length, so long as each byte containing an error is located within a different one of the three interleaves.

As was true with the single burst error correction method described in the referenced Machado patent, the Galois field employed by the present error correction example is generated from the following polynomial:

$$P(x) = x^8 + x^4 + x^3 + x^2 + 1 \quad (1)$$

[Unless otherwise noted hereafter, the symbol "+" designates a bit-by-bit exclusive-OR operation.]

The first element of the field was selected such that the number of gates needed to implement the multipliers is minimized:

$$alpha^1 = x^5 + x^3 + x + 1 \quad (2)$$

The lookup tables implementing the antilog and log tables for this Galois field are set forth in the microcontroller firmware listing included within the microfiche appendix of this application.

The model for the Reed-Solomon code implemented within the presently preferred embodiment is defined by the following generator polynomial G(x) employing an exponent offset equal to 126:

$$G(x) = x^4 + alpha^{18}.x^3 + alpha^{87}.x^2 + alpha^{18}.x + 1 \quad (3)$$

In factored form, equation (3) is:

$$G(x) = (x + alpha^{126})(x + alpha^{127})(x + alpha^{128})(x + alpha^{129}) \quad (3a)$$

The twelve ECC bytes are generated upon passing all of the user data bytes (and two check bytes) of each 512 byte block through a syndrome generator 10 (shown in FIG. 4) on a serial byte-by-byte basis. The value C(x) is an encoded data polynomial written to the disk which is based upon the data and the cross-check bytes for each data block. The value D(x) is an encoded data polynomial based solely upon the data bytes of the data block. The value C'(x) is the encoded data polynomial C(x) as read back from the disk surface. Thus, C'(x) may contain one or more error bursts which must be detected and corrected, if correctable. The value R(x) comprise the remainder which is related to the value C'(x).

The encoded data codeword C(x) for each syndrome byte within each interleave is produced by the following equation:

$$C(x) = [x^4.D(x) \bmod G(x)] + x^4.D(x) \quad (4)$$

During the readback process through the same syndrome generator 10, the remainder value R(x) for each interleave is recovered, and if not zero, is latched in a remainder latch 68 per the following:

$$R(x) = C(x) \bmod G(x) \quad (5a)$$
$$= R3x^3 + R2x^2 + R1x + R0 \quad (5b)$$

A programmed microcontroller 196 then decodes each partial syndrome byte (Si) of the code word for each interleave in accordance with the following:

$$Si = \frac{R(x) \bmod (x + alpha^{i+126})}{alpha^{(i+126)*4}} \quad (5c)$$

where i=0, 1, 2 and 3 and where the exponential + indicates an addition operation). If the remainder bytes (the coefficients of R(x)) have a non-zero value, there then exists at least one error burst in the read-back data block.

In the presently preferred embodiment given herein, the error correction process above has the capability of correcting on-the-fly at least one error burst for each one of the three interleaves. In this on-the-fly error correction process, the partial syndromes have the following forms:

$$S0 = e1.alpha^{126*L1} \quad (6)$$

$$S1 = e1.alpha^{127*L1} \quad (7)$$

$$S2 = e1.alpha^{128*L1} \quad (8)$$

$$S3 = e1.alpha^{129*L1} \quad (9)$$

The solutions for L1 (location) and e1 (single error value) are as follows:

$$L1 = \log[alpha^{L1}] = \log[S1/S0] \quad (10)$$

$$e1 = S1.(S0/S1)^{127} \quad (11)$$

The system of the present invention also performs double-burst error correction in accordance with the following partial syndromes:

$$S0 = e1.alpha^{126*L1} + e2.alpha^{126*L2} \quad (12)$$

$$S1 = e1.alpha^{127*L1} + e2.alpha^{127*L2} \quad (13)$$

$$S2 = e1.alpha^{128*L1} + e2.alpha^{128*L2} \quad (14)$$

$$S3 = e1.alpha^{129*L1} + e2.alpha^{129*L2} \quad (15)$$

In order to solve these equations, the following steps are performed.

1. Values for $\phi 1$ and $\phi 2$ are found:

$$\phi 1 = \frac{S0.S3 + S1.S2}{S0.S2 + S1^2} \quad (16)$$

-continued $$\phi 2 = \frac{S1.S3 + S2^2}{S0.S2 + S1^2} \quad (17)$$

2. Roots X1 and X2 of error-locator $\phi(x)$ are found:

$$\phi(x) = x^2 + \phi 1.x + \phi 2 = 0 \quad (18)$$

There are several ways for solving the linear quadratic equation (18). One classic way is to implement a Chien Search loop which substitutes all Galois Field elements into the equation and detects for zero value. When a zero-value result is found, the loop stops and the input element is thereupon defined as X1. If no solution is found, an uncorrectable error event has been detected. Since equation (18) is a linear quadratic equation, $$\phi 1 = x1 + x2 \quad (18a)$$

X2 may be found as follows:

$$X2 = X1 + \phi 1 \quad (19)$$

3. Locator values L1 and L2 are then evaluated:

$$L1 = \log[x1] \quad (20)$$

$$L2 = \log[x2] \quad (21)$$

4. Error values e1 and e2 are then evaluated:

$$e1 = \frac{S0.X2 + S1}{X1^{126}.\phi 1} \quad (22)$$

$$e2 = \frac{S0.X1 + S1}{X2^{126}.\phi 1} \quad (23)$$

Given appropriate processing capabilities and speed at the microprocessor 196, and given a reasonable user confidence level in the correction process, it is practical to correct double burst errors on-the-fly with the present methodology.

In order to reduce the probability of miscorrection below 0.233 for multiple random errors, a generator polynomial $G_{xc}(x)$ has been selected for performing a Reed Solomon cross check. This generator polynomial is of the form:

$$G_{xc}(x) = X^2 + \text{alpha}^1 \quad (24)$$

This cross check polynomial turns out to be a surprisingly powerful algorithm. It cross checks the error correction process and is sensitive to scrambling or misordering of the data values within the data block. This cross-check method is designed so that it may be carried out on-the-fly for the case at least of a single burst error per interleave, and with sufficient processing speed, for the case of a double burst error per interleave.

If a particular error exists, a correct way of expressing the error is as a polynomial E(x) where:

$$E(x) = e_i x^{li} \quad (25)$$

In order to determine the effect of the error correction made to a data block on the corresponding cross check syndrome, alpha$^1$ is substituted into the error polynomial (25) for x, and then the cross check syndrome (XC) is updated. Syndrome cross check (XC) = previous (XC) + $e_i$alpha$^{li}$, wherein $e_i$alpha$^{li}$ is computed by a programmed microcontroller 196 described hereinafter. If the updated cross check bytes are not zero after the correction has been made to the data field, then the error is determined to be uncorrectable by the present methodology.

This approach provides a very rapid, on-the-fly method for verifying an error correction to determine that the present error burst is not within a predetermined miscorrection probability, such as 0.233, for the double burst correction case for example, and that an error correction operation performed on-the-fly in the single burst error scenario has not resulted in an erroneous correction or "miscorrection" of the data burst.

As noted it is desirable to use a predetermined alpha$^1$ (a Galois field constant) of a value not equal to 2 in the cross check polynomial (5) above. By selecting a Reed Solomon code with a predetermined beginning offset, e.g. 126, a desirable alpha$^1$ constant turns out to be 2B(HEX), or 00101011 (binary). In this particularly preferred embodiment, there are as many ones as there are zeros in the preferred alpha$^1$ constant. Thus, it has sufficient "mass" or "substance" to be surprisingly effective within the cross check polynomial, as it scrambles itself very rapidly as it propagates through the ECC syndrome generator.

Thus, in choosing the root alpha$^n$ for the cross check polynomial, the roots selected for the ECC polynomial are to be avoided. In the presently preferred embodiment, the ECC roots have been chosen to be n=126, n=127, n=128 and n=129. These values, being different than the cross check root n=1, simplify the firmware and speed up cross checking of single error burst correction per interleave on-the-fly.

The data format for a disk drive in which the present invention is implemented employs a plurality, e.g. eight, radial data zones. Each zone includes plural concentric data tracks wherein each track has a predetermined number of data sectors. Each data sector contains a data ID field, followed by the FIG. 1 arrangement of 512 data bytes, two cross check bytes, and twelve ECC bytes. The data ID field includes an address field followed by three EDC bytes. In order to maximize data storage split data fields or data sectors are employed. By "split data field" is meant that the servo sectors S extend as radial spokes on the data surface and interrupt or "split up" at least some of the data sectors into segments. Zoned data recording techniques of the presently contemplated type employ either a constant disk angular velocity and a variable data transfer rate, or they employ a fixed data transfer rate and e.g. slow the disk speed as the data transducer moves from a radially outer zone to a radially inner zone. Presently, a switched data transfer rate is preferred. Consequently, there are different data transfer rates for the different data zones, and there are different numbers of data sectors within the tracks of the different zones selected to optimize data storage capacity in the disk storage format. Also, as described in commonly assigned U.S. Pat. No. 4,675,652 to Machado, entitled "Integrated Encoder Decoder for Variable Length, Zero Run Length Limited Codes", the disclosure of which is hereby incorporated by reference, a 1,7 RLL coding arrangement is preferably employed for data compaction on the storage surface of a data storage disk 162.

Figure 2:
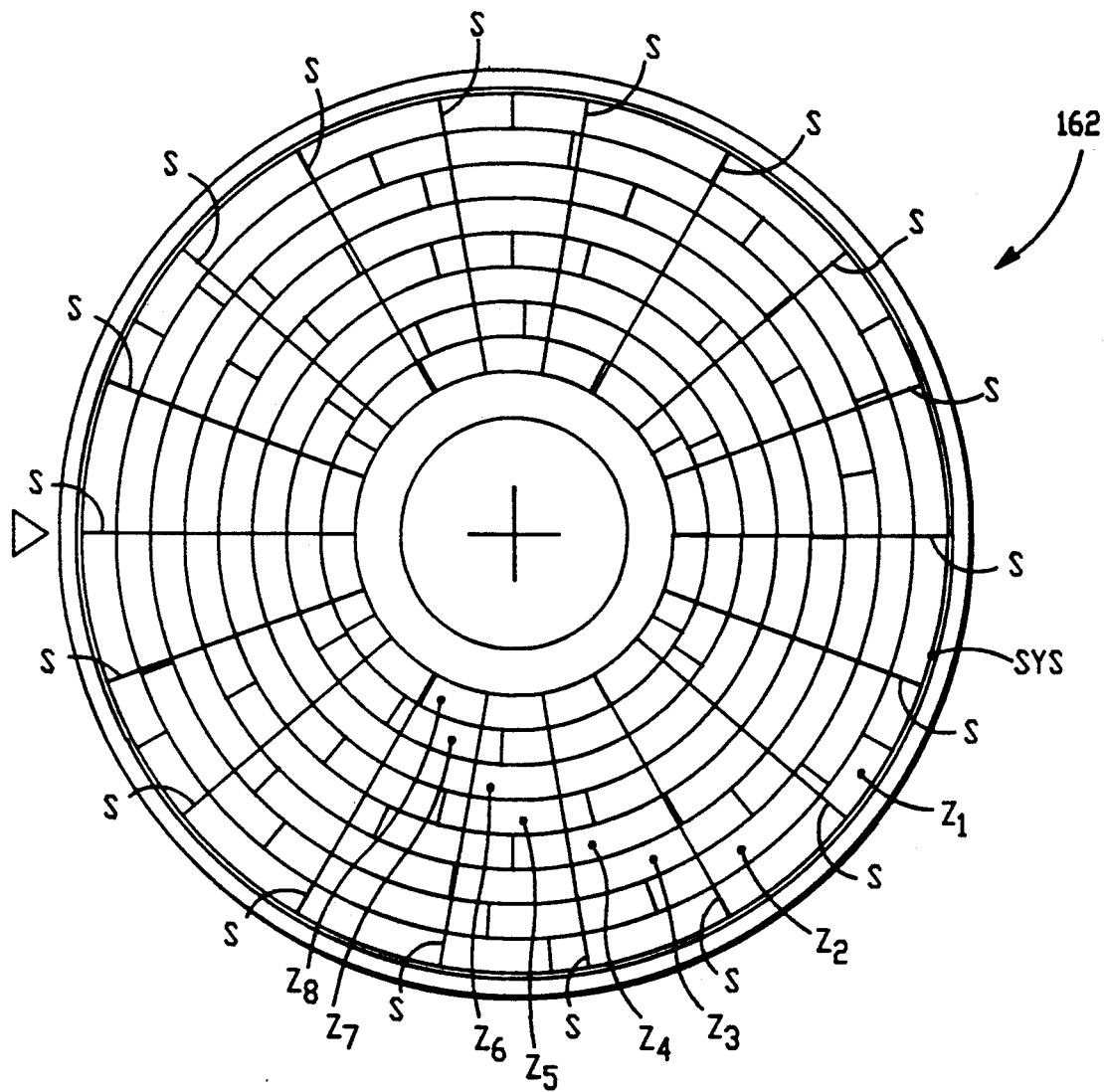
FIG. 2 is a plan view graph of a data surface of a rotating data storage disk, illustrating eight data zones of tracks Z1 through Z8 each having a different data transfer rate and user data storage capacity, and commonly aligned servo sectors S extending throughout the data storage surface.

As shown in the example provided by the FIG. 2 layout diagram, the two opposite data storage surfaces of e.g., a two and one half inch diameter rotating data storage disk 162 may be defined to include a radially outermost zone Z1 having e.g. 110 concentric data storage tracks per surface, each of which includes 60 data sectors and a raw data rate of 18.13 megabits per second (Mbps) (a coded data frequency of 27.20 MHz) for a total storage capacity of 6.48 MBytes, for example. The next radially inward zone Z2 for example may contain 109 data tracks, each of which includes 56 data sectors and has a raw data rate of 17.45 Mbps (a coded frequency of 26.18 MHz). Zone 2 stores 6.19 megabytes of user data on both sides of the disk 162. The third data zone Z3 contains 109 data tracks, each of which has 52 data sectors, and has a raw data rate of 15.69 Mbps (a coded data frequency of 23.53 MHz), and therefore stores 5.75 megabytes of user data on both sides of the disk 162. The fourth data zone Z4 has 109 data tracks, each having 52 data sectors, and has a raw data rate of 15.69 Mbps (a coded data frequency of 23.53 MHz), and therefore stores 5.75 megabytes of user data on both sides of the disk. The fifth data zone Z5 may have 109 data tracks, each having 47 data sectors, and has a raw data rate of 14.77 Mbps (a coded data frequency of 22.15 MHz), to achieve storage of 5.19 megabytes of user data on both sides of the disk 14. The sixth data zone Z6 has 108 data tracks, each having 44 sectors, and has a raw data rate of 14.00 Mbps (a coded data frequency of 21.00 MHz), and achieves a capacity of 4.81 megabytes of user data on both sides of the disk 162. The seventh data zone Z7 has 108 data tracks, each having 41 sectors and use a raw data rate of 12.95 Mbps (a coded frequency of 19.43 MHz) so as to store 4.48 megabytes on both sides of the disk 162. The eighth data zone Z8 may include 108 data tracks, each having 39 data sectors for example, and has a raw data rate of 12.09 Mbps (a coded frequency of 18.13 MHz) in order to store 4.26 megabytes on both sides of the disk 162. A radially outermost region SYS of the data surface 12, e.g. comprising 14 concentric data tracks following the Zone 8 format, may contain system information needed for operation of the disk drive subsystem 100. Several tracks inside of the eighth data zone, and having the bit transfer characteristics of the eighth data zone may be made available for storage of system diagnostics and other values.

While these eight data zones are described as having the characteristics given above, it is to be understood that the number of zones, the number of tracks and sectors per zone, and the data transfer rates within each zone, may vary from the examples given, as is well understood by those skilled in the art, depending upon head and media design and quality, head position servo system, and desired storage capacity. In the present example, a data storage capacity of 42.91 Megabytes is achieved with a single 2½ inch diameter thin-film media data storage disk 162 and with thin film data transducer heads 170a and 170b.

The data transfer frequencies employed within each zone are preferably synthesized e.g. by a frequency synthesizer 190 operating under the control of the system microcontroller 196. The synthesizer is therefore set to synthesize and put out to a PLL 188 the coded frequency for each data zone.

What is to be considered important from the FIG. 1 example is the inclusion of count bytes within each data sector ID field, which enables a data sequencer 100 to determine immediately the structural layout of the immediately following data field of the sector. This layout may or may not comprise a split data field and include one or more interrupting servo sectors, as shown in FIG. 2.

FIG. 2 also illustrates diagrammatically a plurality of uniformly spaced apart servo sectors S (e.g. 52 servo sectors) which are uniformly disposed about the data surface of a storage disk 162 and are embedded between or actually interrupt the data sectors in each zone. Since these servo sectors S "interrupt" at least some of the data sectors, following every servo sector interruption there is a special data sync field to enable the drive to resynchronize to the data rate. The data field count information provided in the data block ID field is used by the data sequencer 100 during the data writing and readback process to determine the layout (i.e. number of and locations of servo sector interruptions and the length of each resultant data field segment) of the data field of interest. Since the byte position counts may vary from data ID field to data ID field, it is very important to confirm the accuracy of the information recovered from the ID field in real time. The present invention advantageously employs the same syndrome generator circuit 10 (FIG. 4) in order to perform Reed Solomon error detection process in real time for each one of the data ID fields read by a selected head 170.

Figure 3A:
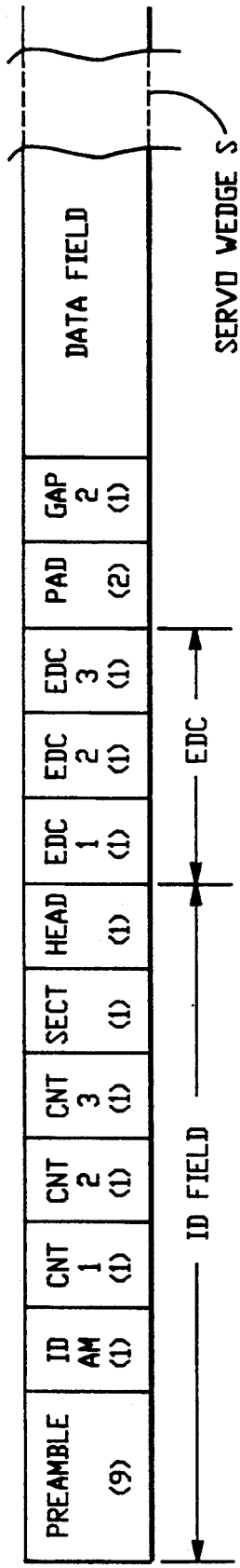
FIG. 3A is a schematic graph of a data ID field for a data sector as shown in the FIG. 2 graph and employing a three byte error detection code.

FIG. 3A illustrates a presently preferred data block ID field arrangement particularly well suited for split data field formats. Each ID field includes a nine byte preamble, an ID field address mark byte, three data field count bytes: count 3, count 2 and count 1; a sector identifier byte; and a head identifier byte. There are then three error detection code bytes: EDC byte 1, EDC byte 2, and EDC byte 3, followed by a two byte pad, a write splice gap (gap 2) byte, and the data field, which ends at a servo sector S location. The values present within the three count bytes determine respectively the lengths of up to three segments of the data field as may be interrupted by servo sectors. For example, if there are no interruptions of the data field, count byte 1 would indicate a full field segment length of 512 bytes for example. If there are two servo sector interruptions of the data field, as is the case with some data blocks, count byte 1 would set forth the byte length of the first data field segment, count byte 2 sets forth the byte length of the second data field segment, and count byte 3 sets forth the length of the third data field segment, for example.

With the ID fields used in the preferred zoned data recording scheme containing byte count values, it becomes very important to provide an error detection method which will check the validity of the information read back from each ID field. A three byte code is presently preferred in this application having split data fields with embedded servo sectors S interrupting at least some of the data blocks. An important aspect of the present invention is to provide an error detecting coding arrangement which makes use of the FIG. 4 syndrome generator. Such an arrangement has been discovered. The following presently most preferred code will generate three error detection check bytes which are appended to each data ID field:

$$G_{EDC3}(x) = x^3 + ax^2 + bx + c \qquad (26)$$

In presently preferred form, this error detection code may be expressed as follows:

$$G_{EDC3}(x) = x^3 + \text{alpha}^{87}.x^2 + \text{alpha}^{87}.x + 1 \qquad (26a)$$

In factored form, equation 26a is rewritten:

$$G_{EDC3}(x) = (x + \text{alpha}^0)(x + \text{alpha}^{108})(x + \text{alpha}^{147}) \quad (26b)$$

It is apparent by inspection that these alpha coefficients are not consecutive. This code will generate three error detection bytes. Since the syndrome generator depicted in FIG. 4 already has the alpha$^{87}$ multiplier logic, that logic is available for use in the error detection process.

Figure 3B:
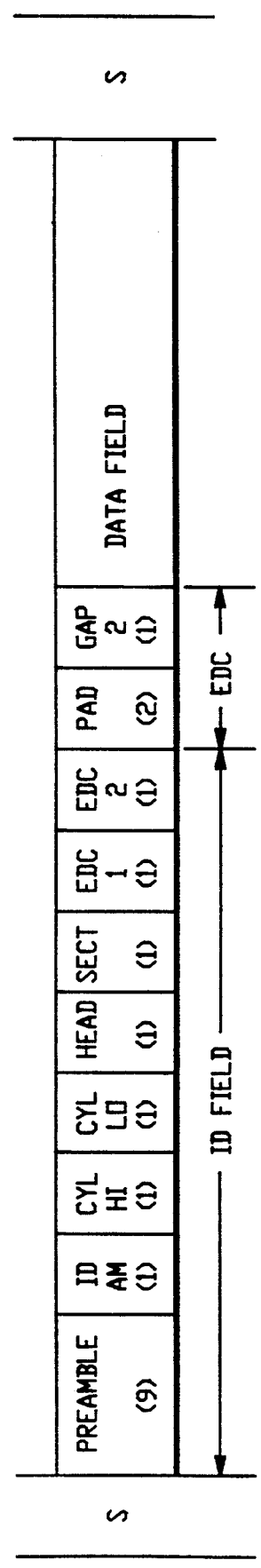
FIG. 3B is a schematic graph of a data sector ID field not including count information, and therefore able to employ a less powerful two byte error detection code.

For drives not employing embedded servo sectors which interrupt data fields of data sectors (and in which the data ID sectors do not contain byte counts) a two byte error detection code has been determined to be sufficient. One example of an ID field employing a two byte error detection code is depicted in FIG. 3B. In the example given in FIG. 3B, the ID field includes a nine byte preamble, an ID field address mark byte, a cylinder high byte, a cylinder low byte, a head byte, a sector byte, and two error detection code (EDC) bytes: EDC 1 and EDC 2. These EDC bytes are followed by a two byte pad, and by a gap 2 byte before reaching the data field which continues uninterrupted until the next data sector, which may be preceded by an embedded servo sector S.

A presently most preferred two byte EDC code may be generated by the following generalized relationship:

$$G_{EDC2}(x) = x^2 + ax + b \quad (27)$$

where b is unequal to one. A more specific form of this relationship is:

$$G_{EDC2}(x) = x^2 + x + \text{alpha}^{18} \quad (27a)$$

In factored form, equation 27a is:

$$G_{EDC2}(x) = (x + \text{alpha}^{22})(x + \text{alpha}^{251}) \quad (27b)$$

Figure 4A:
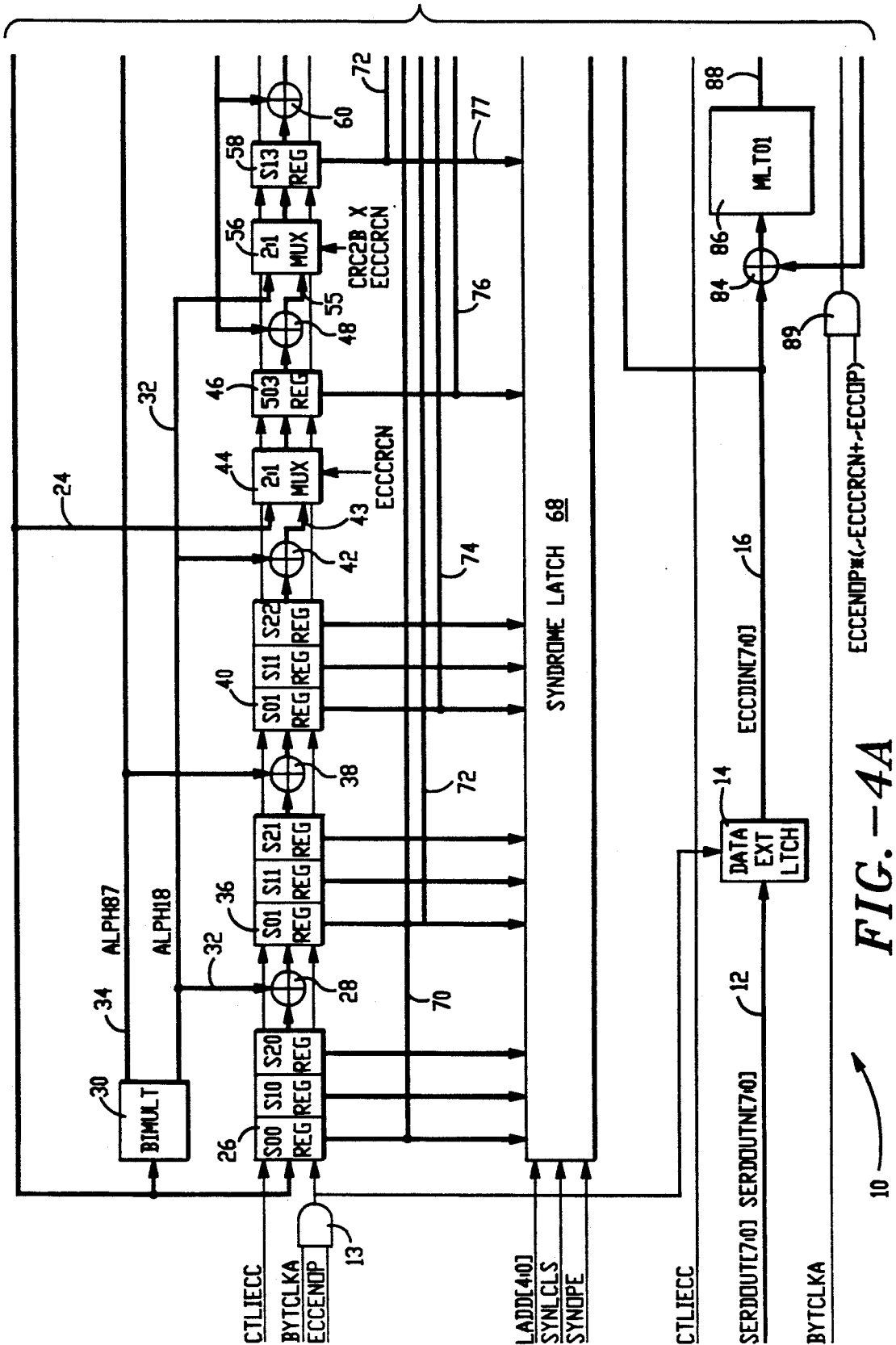
FIG. 4(A)(B) are a detailed block diagram of an ECC encoder/decoder and cross checking structure implementing the methods of the present invention.
Figure 4B:
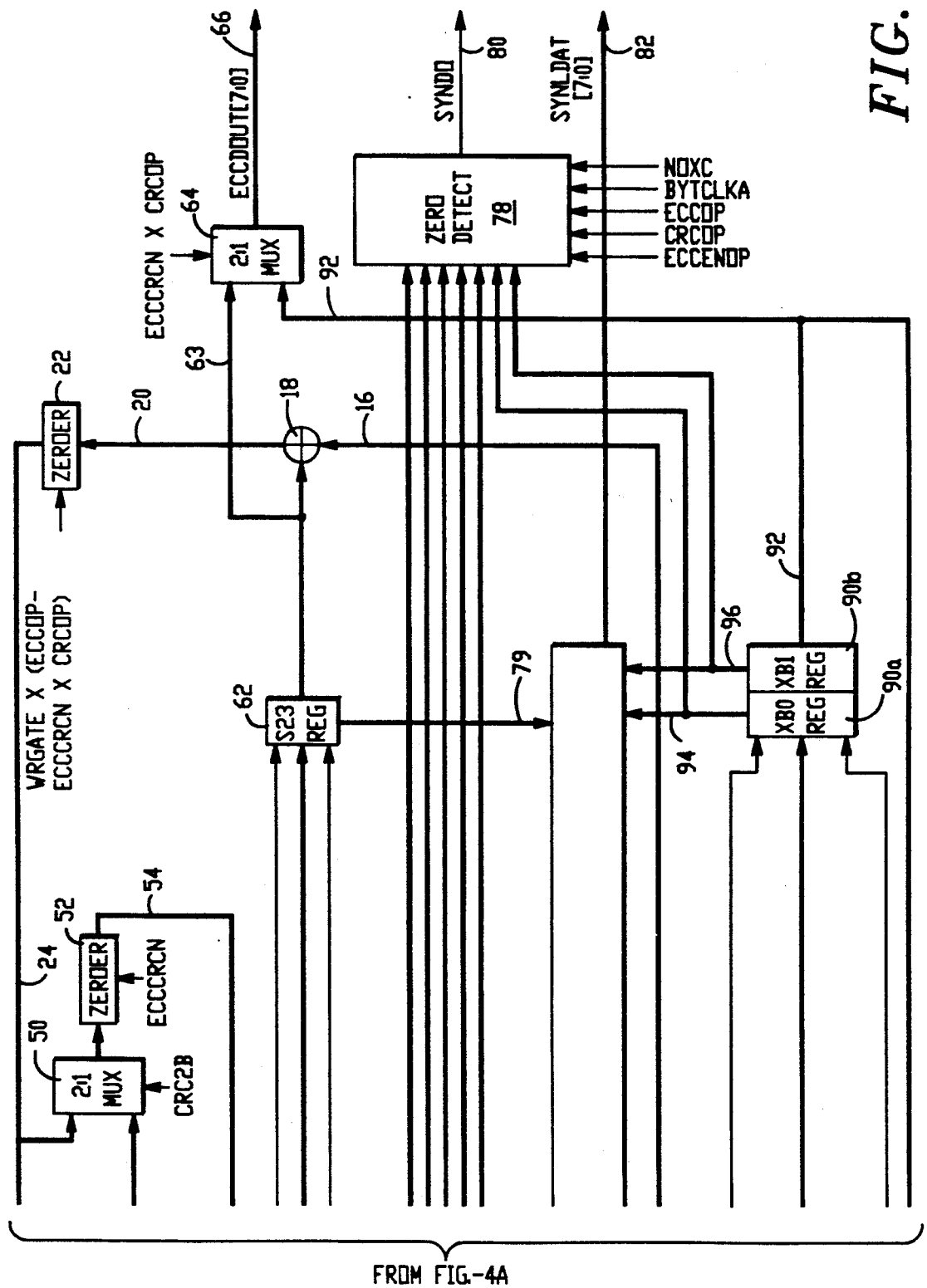

With this code, only one multiplier circuit is required: alpha$^{18}$, which circuit is already present in the FIG. 4 ECC syndrome generator circuit.

Other EDC codes are known to be available for detecting errors within the ID field of a data block. However, each of the following algorithms require an additional multiplier term, and therefore are slightly more complicated to implement than the algorithms (26) and (27) given above.

A presently less preferred three byte EDC code may be generated by the following relationship:

$$G_{EDC3}(x) = x^3 + \text{alpha}^{81} \cdot x^2 + \text{alpha}^{87} \cdot x + \text{alpha}^{18}. \quad (28)$$
$$= (x + \text{alpha}^5)(x + \text{alpha}^6)(x + \text{alpha}^7) \quad (28a)$$

A presently less preferred two byte EDC code may be generated by the following relationship:

$$G_{EDC2}(x) = x^2 + \text{alpha}^{81} \cdot x + \text{alpha}^{81}. \quad (29)$$
$$= (x + \text{alpha}^{105})(x + \text{alpha}^{231}) \quad (29a)$$

With reference to FIG. 4, an ECC syndrome generator circuit 10 simultaneously implements circuitry for performing the ECC function for the data fields, the cross checking function for the data fields, and the EDC function for the data block ID fields. These multiple functions carried out within a single, simplified circuit 10 facilitate on-the-fly error correction in accordance with the present invention. The FIG. 4 ECC circuit 10 includes an incoming serial data bus 12 carrying serial-by-byte data. In accordance with the output state of a logic gate 13, a data extender latch 14 passes the serial data on the bus 12 onto an internal ECC bus 16. The bus 16 leads to a byte-wide exclusive OR (herein XOR) gate array 18 wherein each incoming byte is exclusive-ORed (herein XORed) with a byte exiting the ECC portion of the circuit 10 on an outflow bus 63. The resultant sum is passed by the gate 18 onto a bus 20 which leads through a zeroer circuit 22 to another bus 24. The zeroer circuit 22 is used to force bus 20 to zero when appending ECC or EDC bytes to data fields, such as during data writing to disk operations or disk format operations, for example.

The bus 24 leads into a three byte register 26, the output of which leads to an XOR gate array 28. The bus 24 also leads to a bi-coefficient multiplier which generates and puts out an alpha$^{18}$ product on a bus 32 and which also generates and puts out an alpha$^{87}$ product on a bus 34. The alpha$^{18}$ product is XORed with the output from the shift register 26 in the byte-wide exclusive OR gate array 28, with the resultant sum then passed through another three byte shift register 36. The alpha$^{87}$ product on the bus 34 is then XORed with the output from the register 36 in another byte-wide XOR gate array 38. An output sum of the XOR array 38 passes through another three byte shift register 40 and, the alpha$^{87}$ product on the bus 32 is XORed with the output from the shift register 40 and yields an output sum on a bus 43.

The output sum on the bus 43 is then selectively passed through a multiplexer 44 to a single byte register 46. The multiplexer 44 operates in conjunction with the EDC process, explained hereinafter. An output from the single byte register 46 is then XORed with the alpha$^{87}$ product on a bus 54. In this regard, the alpha$^{87}$ product on the bus 34 passes through a multiplexer 50 and a zeroer circuit 52 to reach the bus 54. An output on a bus 55 from an XOR gate array 48 then passes through a multiplexer 56 to reach a second single byte shift register 58. The multiplexers 50 and 56 are used to select between ID fields having either two EDC bytes, or three EDC bytes.

An output of the register 58 is then XORed with the alpha$^{87}$ coefficient on the bus 54 in an XOR gate array 60. A resultant sum put out by the XOR array 60 is then passed into and through a single byte shift register 62 which leads directly to the output bus 63. It is apparent that the last register group comprising registers 46, 58 and 62 are split up by the XOR gate arrays 48 and 60 so that the EDC function can be carried out on either two or three EDC bytes. In this manner a Reed-Solomon error detection code of either two bytes or three bytes for checking data sector ID fields may readily be realized and implemented within the existing ECC syndrome generator 10 with minimal additional circuitry.

During normal ECC operations, the zeroer circuit 52 presents zero coefficients, in lieu of either an incoming byte value (two byte EDC) or the alpha$^{87}$ product (three byte EDC). Thus, during normal ECC operations, the XOR gate arrays 48 and 60 are functionally inoperative in the paths between the registers 46, 58 and 62. The multiplexer 56 places the alpha$^{87}$ product into the register 58 during a two byte EDC operation.

The output bus 63 from the last register 62 leads through a multiplexer 64 to an ECC output bus 66 which enables the circuit 10 to generate and clock out in proper time twelve ECC syndrome bytes which are appended into the ECC check byte positions of each data field, as depicted in FIG. 1. Two control signals: a byte clock signal BYTCLKA, and an ECC enable operation signal ECCENOP are combined in the AND gate 13, and its output then provides a master clock signal for clocking bytes progressively through the latch 14, and the shift registers 26, 36, 40, 46, 58 and 62. The shift registers 26, 36, 40, 46, 58 and 62 are initialized with predetermined initial values by assertion of an initialization control signal CTLIEC. The values may be arbitrarily selected, but are repeated at each initialization of the shift registers.

As noted hereinabove a syndrome remainder latch 68 is provided within the syndrome generator circuit 10. This latch 68 receives and stores a number of remainder bytes. Three remainder bytes are received from the register 26 including a first byte over a bus 70. Three more remainder bytes are received from the shift register 36 including a fourth byte over a bus 72. Three more remainder bytes are received from the shift register 40 including a seventh byte over a bus 74. A tenth remainder byte is received from the single byte shift register 46 over a bus 76; and an eleventh remainder byte is received from the shift register 58 over a bus 77; while a twelfth remainder byte is received over a bus 79.

The remainder latch 68 is controlled by three control signals. First, a five bit control signal LADD[4:0] comprises the five least significant address bits of the microcontroller cycle currently in operation. These five address bits are used by the microcontroller in order to fetch a particular latched remainder byte for processing by the microcontroller 196 during an on-the-fly ECC operation. Second, a syndrome latch close control SYNLCLS signal is used to operate the remainder latch 68 to latch a particular (e.g. non-zero) remainder for on-the-fly ECC operations. The remainder latch 68 is normally in the transparent mode. Upon detection of an error as at the output line 80, the data sequencer 100 asserts this signal asynchronously to latch the remainder bytes from the shift registers 26, 36, 40, 46, 58 and 62. This operation is carried out before a reinitialization which occurs for the next data sector. Thus, the twelve byte ECC syndrome remainder provides the information from which the error location(s) and error value(s) can be determined by the microcontroller 196 and corrected while the next data sector is being circulated through the syndrome generator circuit 10 and its remainder bytes are being recovered. Third, a syndrome latch open control SYNLOPE signal must be the opposite of the syndrome latch close control signal. This SYNLOPE signal is true when the syndrome remainder latch 68 is in its transparent mode, and low when the syndrome latch 68 is latched.

The byte values on the buses 70, 72, 74, 76, and 77 are passed to the zero detect circuit 60 and checked to see if they are zero. Since syndrome bytes progressively clock through the shift register groups 26, 36 40 and the last group of individual shift registers 46, 58 and 62 in three interleaves, only those bytes from the first one of each of the four groups of syndrome registers need to be input to the zero detect circuitry for ECC syndrome zero checking. This arrangement saves logic elements. A parity with zero during data read operations indicates no errors have been detected within the present data block.

Five control values enter the zero detect circuit 78: the ECC enable operation control ECCENOP; an error detection operation control CRCOP; an error correction operation control ECCOP; the byte clock signal BYTCLKA, and a no cross check operation control NOXC. These control signals progressively enable the zero detect circuit 78 to determine whether a particular ECC syndrome, cross check syndrome or EDC syndrome is zero, thereby facilitating on-the-fly correction.

A single bit remainder output control value is presented on a line 80. This line will be at one logical state when the remainder bytes being checked are equal to zero, and it will be at another logical state when there is no parity with zero, as determined by the zero detect circuit 78. An on-the-fly service routine is called by the microcontroller 196, and as part of the execution thereof, the syndrome byte values actually latched by the syndrome latch 68 are put out over a syndrome data bus 82 to the microcontroller 196 of the disk file whenever the single bit syndrome value on the line 80 indicates non-zero parity. Such a condition could arise from checking the twelve ECC bytes appended onto each data field. Another error condition microcontroller intervention could arise from checking either a three byte ID check field, or a two byte ID check field, during an error detection code (EDC) operation, for example.

Once the microcontroller 196 locates and corrects an error burst in a sector on-the-fly, the possibility of a miscorrection having occurred is then tested by having the microcontroller 196 determine the impact of the correction of data upon the cross check remainder bytes which are also held in the remainder latch 68 and read by the microcontroller 196 as needed.

In order to obtain the cross check remainder bytes, the data block on the ECC data bus 16 is passed through an exclusive OR gate 84. An output from the gate 84 is passed through a multiplier 86 which calculates and puts out an alpha$^1$ product on a bus 88. The alpha$^1$ product is then latched into two byte cross check shift registers 90a and 90b. An output from the shift register 90b feeds back to the XOR gate array 84 and also provides another input to the multiplexer 64, so that the cross check bytes can be appended to the data field as shown in FIG. 1.

An output bus 94 from the register 90a enables the first cross check byte to be latched into the syndrome latch 68 and also to be checked by the zero detect circuit 78. Similarly, an output bus 96 from the register 90b enables the second cross check byte to be latched into the remainder latch 68 as well as checked for zero parity by the zero detect circuit 78.

When an ECC remainder byte value is determined not to be zero and the twelve ECC remainder bytes are latched into the remainder latch, the two cross check remainder bytes then present in the registers 90a and 90b are also latched into the remainder latch 68. The cross check remainder bytes are then converted into partial syndrome bytes XC1 and XC2. After an ECC operation following calculation of an error burst correction by the microcontroller 196, it then calculates the impact of the correction upon the partial syndrome bytes XC1 and XC2. If those bytes, after correction of the data error, are not zero, an error which cannot be corrected by on-the-fly error correction is determined to be present, the data stream is stopped, and retries may then be handled in accordance with conventional ECC procedures, invoked in accordance with e.g. the SCSI interface convention, as one example. Ultimately, if the cross check remainder bytes are not zero after a correction, the error is determined to be uncorrectable, and the disk drive stops and informs the host equipment that an uncorrectable error has occurred. If the cross check bytes are zero after error correction, a possibility of a miscorrection of data is thereby determined to be significantly reduced.

The cross check shift registers 90a and 90b are initialized by the initialization control signal CTLIEC which sets them to a known state, and are clocked by the byte clock signal BYTCLKA and by a signal indicating that ECC and cross check operations are being performed (instead of an ID field error detection operation), as determined by a control gate 89.

The following description summarizes the various control and data signals whose labels appear in FIG. 4. Timing for these signals is provided in the timing graphs set forth in FIG. 5.

SYNLDAT[7:0] Syndrome Latched Data: A byte of syndrome data is read out from the selected latched syndrome byte position as determined by the address on the five bit latched address (LADD) bus. This byte is passed over a microcontroller address/data bus during a microcontroller read operation. This data is strobed by a RSECC control signal.

LADD[4:0] Latched Address Bus: The five least significant address bits of the microcontroller address cycle currently in operation are input to address a particular one of the byte registers of the syndrome latch 68. These five address bits are used to determine which latched syndrome byte will be read out to the microcontroller 196 during a microcontroller read operation.

SYNLCLS Syndrome Latch Close: This signal is used to close the syndrome latch 68 for on-the-fly error correction. The syndrome latch 68 is normally in the transparent mode. On detection of an error in the ECC syndrome, a data sequencer circuit 100 (FIG. 6) asserts this signal asynchronously to latch the data from the syndrome generator shift registers into the syndrome latch 68 so that the syndrome data indicative of the error will not be lost. This assertion by the data sequencer 100 is done prior to a reinitialization that occurs for the next data sector via the initialization control signal CTLIEC. Thus, the syndrome containing the encoded error location can be decoded by the microcontroller 196, and corrected while the next sector is being read and passed through the syndrome shift register sets 26, 36, 40 and the last group of registers 44, 58 and 62.

SYNLOPE Syndrome Latch Open: This control signal must be the opposite of the Syndrome Latch Close control signal. It is true when the syndrome latch 68 is in its transparent mode (latch output=syndrome) and false when the syndrome latch 68 is latched and static.

ECCCRCN ECC/CRC Control: This signal indicates what type of syndrome the ECC generator 10 is to calculate. When true, this control line indicates that ECC and a cross check are to be computed on data bytes. When false, this line indicates that EDC is to be computed on the bytes of an ID field.

CTLIEC Control Interrupt ECC: When true, this control line asynchronously sets all syndrome bytes of both the ECC generator and the cross check generator to a predefined initialization value, which may be an invariant, yet arbitrary pattern of ones and zeros.

WRGATE Write Gate: This control signal is used while either CRCOP (error detection of ID field) or ECCOP (ECC operation) are asserted true in order to stop the syndrome generator from continuing to calculate the syndrome while it is being clocked out by the byte clock BYTCLKA.

CRC2B EDC Two Byte Format: When asserted true, this control signal selects a two byte format for the EDC on the data ID field. In this case, the same syndrome generator is used for two byte EDC. When deasserted, this line selects a three byte EDC syndrome process.

SYND0 Remainder Equals Zero: This control signal put out by the zero detect circuit 78 is used for detecting errors. On two byte EDC formats, this signal will be asserted following the rising edges of BTYCLKA if both EDC remainder bytes are equal to zero. With three byte EDC formats and during ECC operations, this control signal will indicate a zero EDC remainder byte condition if, following the final three rising edges of the byte clock BYTCLKA, this signal is asserted true. That is to say, if, on the last two rising edges of BYTCLKA, ECCENAB is asserted true, and on the rising edge after BYTCLKA after ECCENAB deasserts this signal is true, then the ECC remainder bytes are equal to zero.

SERDOUT[7:1] Serial/Deserial Data Out: This bus 12 carries in data bytes to the ECC circuitry 10 upon which a syndrome is to be computed. Data must be valid on the rising edge of BYTCLKA. On data sequencer read operations, ECCIN data comes from the serializer/deserializer SERDES 106, as more fully explained in the previously referenced, commonly assigned U.S. Pat. No. 4,675,652 to Machado. All of the data bytes, cross check bytes and ECC bytes are clocked in synchronism with BYTCLKA. On data sequencer write operations, ECCIN data comes from the FIFO buffer memory; all data bytes are clocked in synchronism with BYTCLKA, and the cross check bytes and the syndrome bytes are calculated and appended to the data stream. Following the final data byte, ECCIN must be connected to ECCOUT, so that the ECC syndrome may be calculated on the cross check bytes.

ECCDOUT[7:0] ECC Data Out: This bus 66 carries data out of the ECC circuit 10. Data is valid on the rising edge of BYTCLKA. ECC syndrome data is available at this port in byte serial format while WRGATE and ECCOP control lines are asserted true. EDC syndrome data is available while WRGATE and CRCOP control lines are asserted true.

BYTCLKA Byte Clock A: This signal represents the basic clocking signal for all ECC and EDC operations.

ECCENOP ECC Enable Operations: This control line indicates which BYTCLKA edges contain data for the ECC circuit 10. The BYTCLKA signal is gated internally with this signal in the AND gate 13 so that any transient errors will not occur while BYTCLKA is true.

CRCOP EDC and Cross Check Control: This control line indicates which bytes are EDC bytes, and which bytes are cross check bytes. This signal must be asserted true on the rising edge of BYTCLKA on which an EDC or cross check byte will be clocked into the ECC generator block 10.

ECCOP ECC Operation Control: This control line indicates which bytes are ECC bytes. This signal must be asserted true on the rising edge of BYTCLKA during which an ECC byte will be clocked into the ECC syndrome generator 10.

Figure 5:
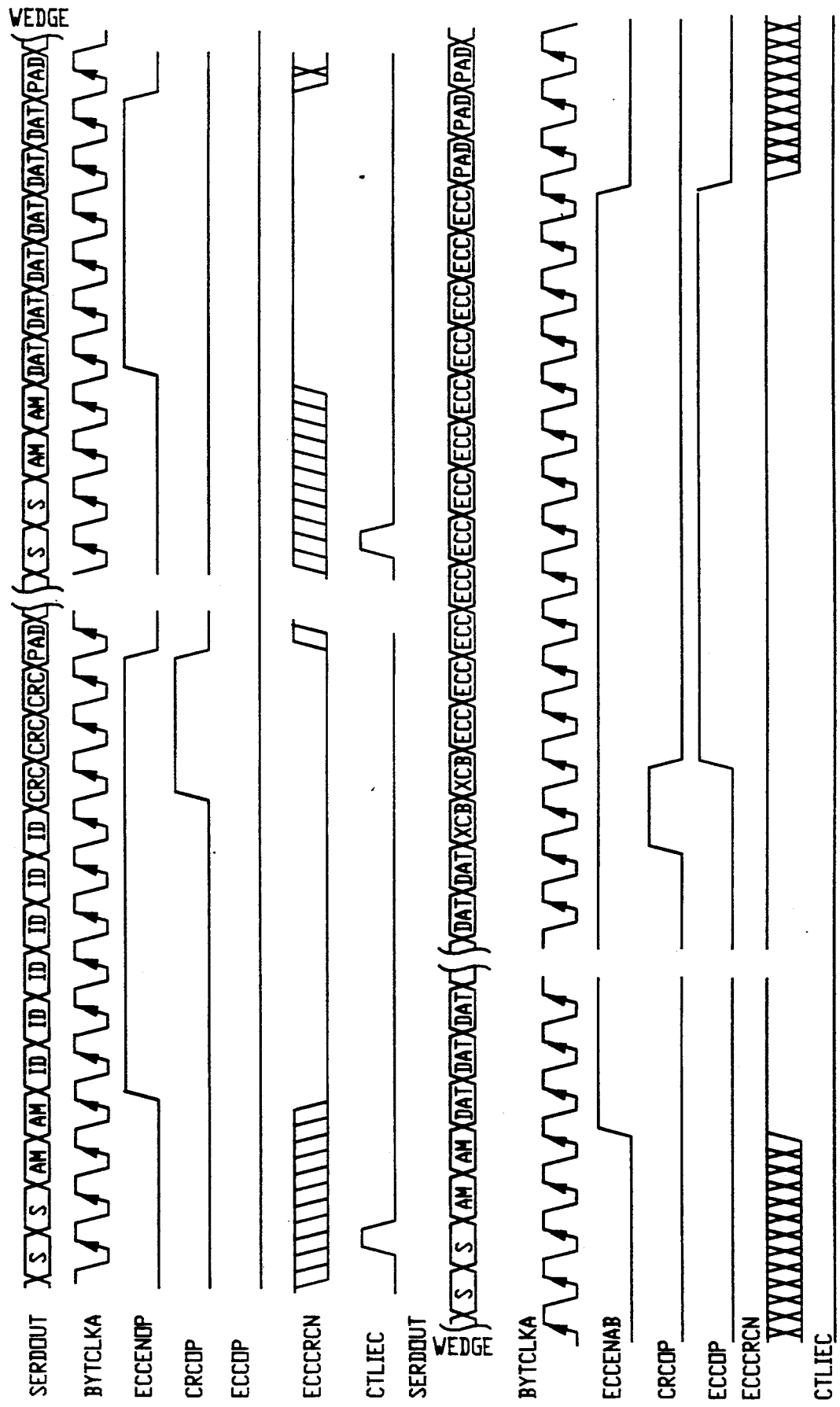
FIG. 5 is a series of timing diagrams illustrating operation of the FIG. 2 ECC structure.

With reference to the timing diagrams of FIG. 5, the upper group of timing signals along a common horizontal time base represent the various logical conditions of the listed control signals during an EDC check upon an ID field. The lower group of timing signals in FIG. 5 represent the various logical conditions of the listed control signals during an ECC and cross check operation.

Figure 6A:
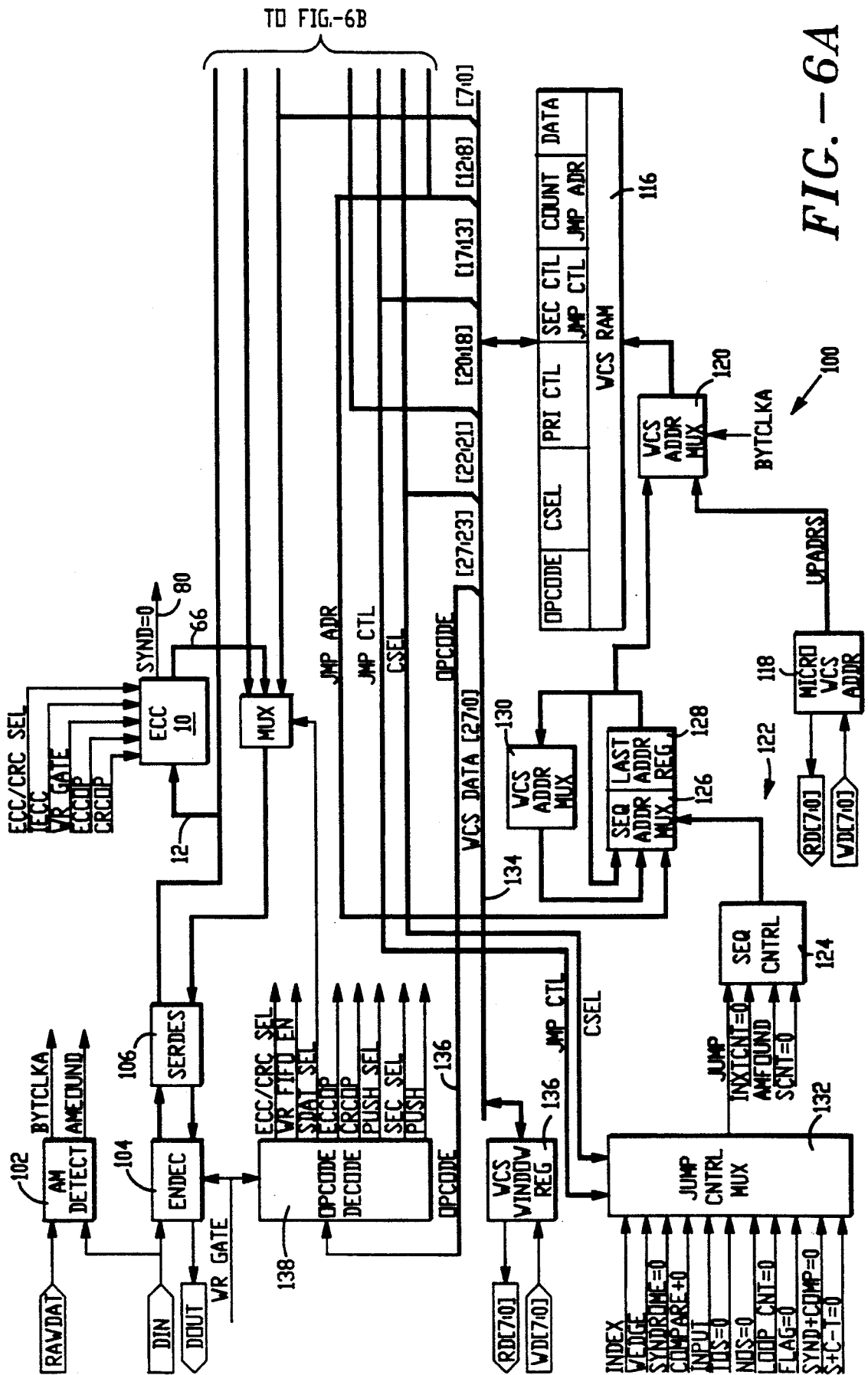
FIG. 6(A)(B) are a block diagram showing the FIG. 2 ECC structure within a data sequencer element of a fixed disk drive.
Figure 6B:
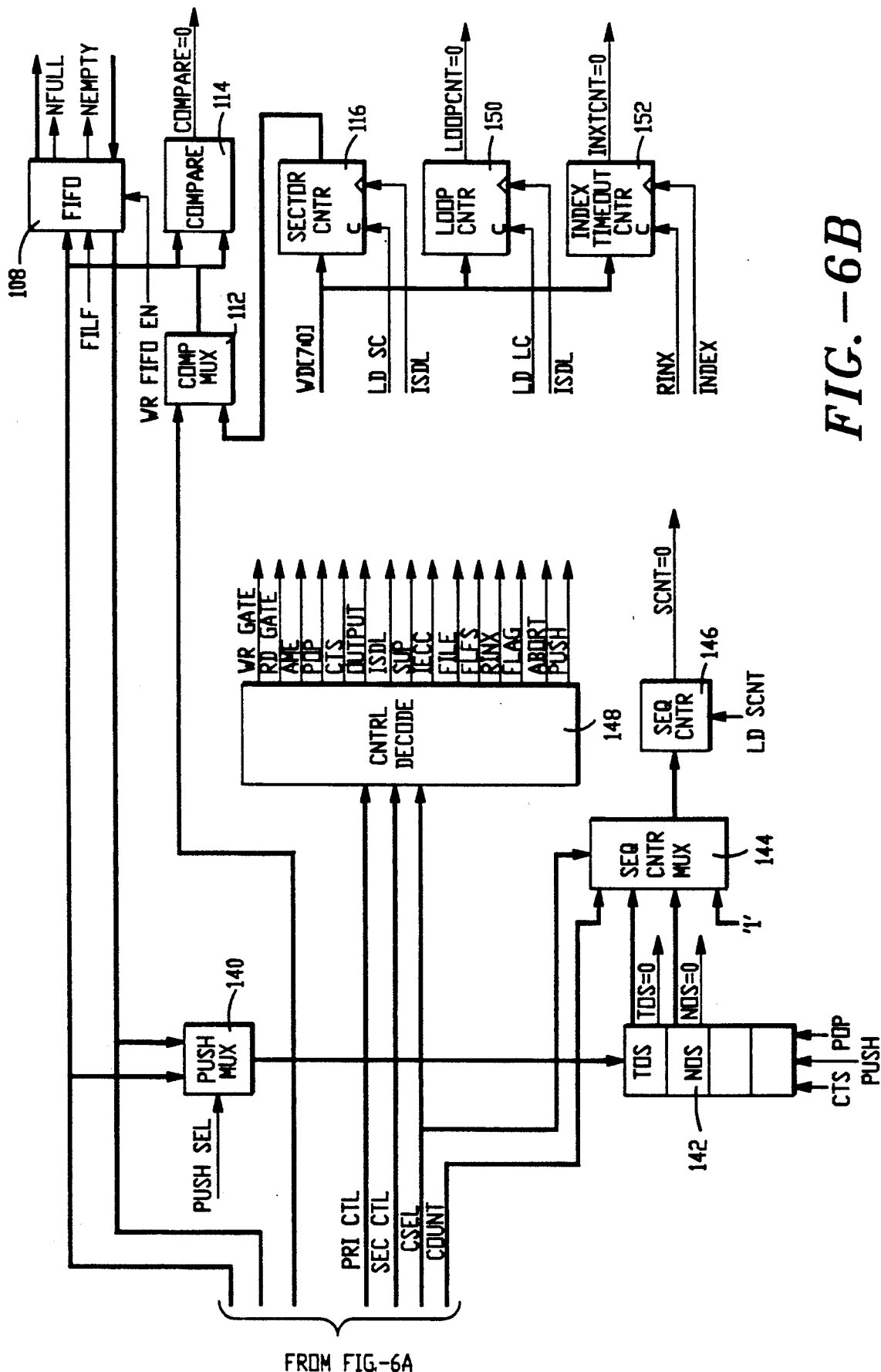
Figure 7:
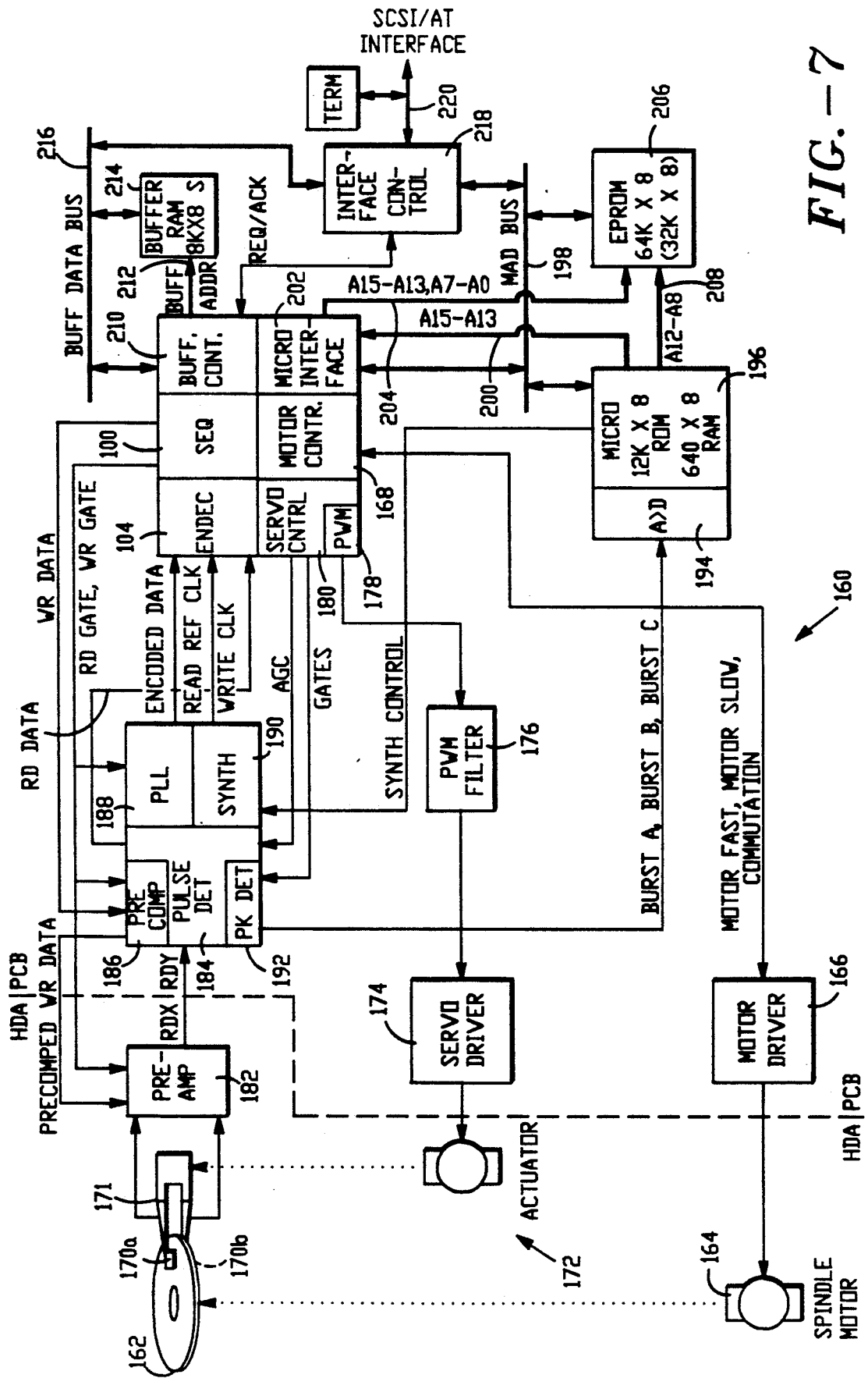
FIG. 7 is a block diagram of a fixed disk drive data storage subsystem including the FIG. 6 data sequencer and ECC structure implementing principles of the present invention.

Turning now to FIG. 6, it is to be seen that the ECC syndrome generator circuit 10 is but one functional element within the data sequencer 100 of an overall disk drive architecture 160, as shown in FIG. 7 and discussed in greater detail hereinafter. The data sequencer 100 includes a data field address mark detector 102 which receives incoming data directly from a pulse detector. The detector 102 looks for a sequence of high frequency flux transitions, and when such is detected, the PLL 188 is then locked to the sequence and the recovered digital run length encoded data is checked for the presence of the address mark sequence. In this regard, the address mark detector 102 monitors the data stream in order to detect a unique bit sequence which is not consistent with the 1,7 encoding rules and which is predetermined to represent an address mark. The address mark detector 102 generates the byte clock signal BYTCLKA from the raw data stream as well as an address mark found control signal whenever a bit sequence representing an address mark is found in the raw data stream.

A 1,7 run length limited encoder/decoder 104 encodes and decodes serial data into and from a 1,7 run length limited (RLL) code, and the serializer/deserializer (SERDES) 106 bundles and unbundles data bytes into and from serial bit-by-bit format. The encoder/decoder 104 and SERDES 106 are substantially as described in the referenced Machado U.S. Pat. No. 4,675,652 noted above. A FIFO byte register 108 enables data bytes to be asynchronously transferred between the sequencer 100 and an external cache buffer memory array 214, clocked by an external crystal clock standard (as opposed to the BYTCLKA which is synchronized with the raw data stream read back from the disk). A multiplexer 110 regulates bidirectional data flow through the serializer/deserializer 106 and encoder/decoder 104 so that ECC syndrome bytes generated by the ECC generator 10 may be appended to data blocks flowing to the storage surface, and so that data values present on a writable control store (WCS) bus 134 may also be sent to the disk for storage.

Reference data sector (i.e. physical sector and transducer head) identification bytes read from data ID fields are passed through a comparison multiplexer 112 to a comparison circuit 114. The comparison circuit 114 compares actual data sector identification bytes received from the SERDES 106 with the reference identification bytes held in a sector counter 116. If a correspondence exists, the desired sector location has been reached, and a Compare=0 control signal is put out by the comparison circuit 114 to a jump control multiplexer circuit 132.

A writable control store (WCS) 116 provides the dual function of storing control words which control all of the operational states of the sequencer 110, and which may be loaded with information directly read and written by the microcontroller 196 at locations thereof controlled by addresses decoded by a microcontroller address decoder 118. During one half of the BYTCLKA clock cycle, a multiplexer 120 enables direct access by the microcontroller 196 to the control store 116.

During the other half of the BYTCLKA cycle, addresses from a sequence controller 122 are used to address the control store memory area 116. The controller 122 includes a sequence control decoder block 124 which enables the controller 122 to jump to a plurality of predetermined states, a sequence address multiplexer which selects between various addresses, a last address register 128 for holding the last sequencer address for application to the control store 116 via the multiplexer 120, and a writable control store multiplexer 130 which selectively feeds back the last address held in the register 128 to the sequence address multiplexer 126.

The sequence controller 122 is directly controlled by a jump control multiplexer 132 which generates a jump control signal from a plurality of logical inputs as indicated in FIG. 6. A 28 bit wide writable control store (WCS) data bus 134 directly communicates with the writable control store memory 116 and enables the values held therein to circulate throughout the sequencer 100 along the paths shown in FIG. 6. An opcode bus 136 leads to an opcode decoder 138 which decodes each five bit op code into a plurality of logical conditions on the control lines shown coming out of the opcode decoder 138. The ECC/CRC SEL line, the ECCOP line, and the CRCOP line directly connect to the ECC syndrome generator 10, as previously explained. A PUSH SEL line extends to a Push multiplexer 140 which enables e.g. data field count bytes C3, C2 and C1 to be pushed directly onto the top of a four byte register stack 142. A top of stack (TOS) bus and a next of stack (NOS) bus connect the stack 142 to a byte sequence counter 146 via a multiplexer 144 which also has the ability to load the sequence counter 146 with "1" values. The byte sequence counter 146 maintains the present byte count (remaining field length in bytes within a block) within the sequencer 100. When the presently loaded byte count increments to zero, the end of a particular field is reached, and the sequence counter 146 puts out a SCNT=0 value to the jump control multiplexer 132, so that a next state may then be invoked.

A control decoder 148 receives primary control bytes, secondary control bytes, and count select bytes from the writable control store 116 and decodes these values into specific logical control values which are put out over the control lines shown coming out of the decoder 148 in FIG. 6, including the write gate signal WRGATE and an initialize ECC signal IECC which directly control the ECC syndrome generator 10.

A loop counter 150 is preset with a number of loops to be made during a particular data block transfer transaction (each loop nominally represents the states required to transfer a data block), and generates a LOOPCNT=0 control value when the count reaches zero. This control value signifying that the required number of data blocks has been transferred is also provided to the jump control multiplexer 132. An index timeout counter 152 keeps track of the beginning of each track by generating an index timeout value INXCNT=0 which is used to control the sequence controller 124. A once per revolution raw index signal stored in the first one of the servo sectors S is detected by the servo control circuit 180 and used to clock the index counter 152. Other inputs to the sequence controller are the jump value from the jump control multiplexer 132, the address mark found value AMFOUND from the address mark detector 102, and the byte sequence counter SCNT=0 value from the sequence counter 146.

Referring to FIG. 7, a fixed disk drive data storage subsystem 160 includes at least one rotating data storage disk 162 which may be a 3.5 inch diameter, or more preferably a 2.5 inch diameter storage disk, for example, (although this invention will work to advantage in conjunction with any practical disk diameter, whether larger or smaller) and which is rotated at a substantially constant angular velocity, such as 3600 RPM, by a spindle motor 164, such as a direct drive brushless DC spindle motor which is formed in conjunction with a disk spindle hub to which the disk 162 is secured. The motor 164 is driven by a motor driver circuit 166 which is controlled by a motor control circuit 168 contained within a VLSI circuit chip also containing the sequencer 100, the ENDEC 104, a servo controller 180 and PWM output 178, a microcontroller interface 202 and a buffer memory controller 210.

The motor control circuit 168 is directly responsive to the servo control circuit 180 which supplies a raw index pulse read from e.g. the first one of the plural servo sectors S. The raw index pulse is timed against the reference frequency, and the servo control circuit 180 delivers speed up or slow down commands to the motor driver 166, as may be indicated from time to time.

A plurality of e.g. thin film data transducer heads 170a and 170b are respectively associated with opposite major data storage surfaces of the at least one data storage disk 162. The data transducer heads are preferably, although not necessarily, mounted to in-line aligned load beams which in turn are attached to vertically aligned arms of an arm assembly 171 of a mass balanced rotary voice coil actuator 172. The heads 170a and 170b operate conventionally in a contact-start-stop relationship with respect to the data surface, and they "fly" above the surface during operations upon an air bearing as is conventional with Winchester fixed disk technology, for example.

A coil of the actuator 172 is driven by a servo driver circuit 174 which develops bidirectional driving current in response from low pass filtered width-modulated pulses received from a filter 176. The filter 176 is connected to the servo pulse width modulator 178 within the servo control circuit 180. Servo pulses which are shaped by a pulse detector 184 and peak detected by a peak detector 192 are converted to digital values in an analog to digital converter 194 and delivered directly to the microcontroller 196. Coarse head position information read by the head 170 from the embedded servo sectors S is directly decoded by the servo control circuit 180 in a manner which is independent of the PLL 188, ENDEC 104 and sequencer 100. The servo control circuit 180 is implemented with a master state machine which establishes timing for the various fields comprising each servo sector, including a track identification field which is decoded by a data reader of the circuit 180 and fine position offset signals. The amplitudes of the fine position offset signals are sampled and held in the peak detect circuit 192 and processed by the microcontroller 196 during a servo phase of its time shared operations. Further details of the servo arrangement presently preferred for the drive 160 are to be found in a commonly assigned U.S. patent application Ser. No. 07/569,065, filed on Aug. 17, 1990, now U.S. Pat. No. 5,170,299, the disclosure of which is hereby incorporated by reference.

Each data head 170a or 170b, for example, is selected by head select circuitry contained within a preamplifier/select/write driver circuit 182, such as a type SSI 32R4610R 2 or 4 channel thin-film head read/write device made by Silicon Systems, Inc, Tustin, Calif., or equivalent. The analog flux transition signals transduced by the selected head are preamplified in a preamplifier portion of the circuit 182 which is preferably mounted to a thin, flexible plastic substrate (Mylar tm) carrying multiple conductive traces within a hermetically sealed head and disk assembly and in close proximity to the data transducer heads 170a and 170b in order to increase the signal to noise ratios of the analog signals recovered from the storage surfaces.

The recovered analog data is then passed through a pulse detector 184 which transforms the analog flux transitions into digital logic edges as is conventional. A write precompensation circuit 186 precompensates data to be written to the disk received from the sequencer 100. The precompensated write data is supplied directly to the head select/preamplifier circuit 182 for delivery to the selected head transducer. A phase locked loop circuit 188 operates to separate the digital edges into data bit pairs (encoded data) and delivers those data bit pairs to the encoder/decoder 104 which is illustrated in FIG. 5 as being a part of the sequencer 100. A frequency synthesizer 190 enables a variety of reference frequencies to be synthesized in order to provide for zoned bit recording as described hereinabove. The synthesizer 190 operates directly under the control of a programmed microcontroller 196. The pulse detector 184, write precompensation circuit 186, PLL 188, frequency synthesizer 190 and servo burst peak detector 192 are all preferably contained within a single VLSI integrated circuit package, such as a type DP8491 made by National Semiconductor Corporation, or equivalent.

A microcontroller address/data bus 198 and a high order address bus 200 extend directly from the microcontroller 196 to a microcontroller interface 202 which directly communicates with the sequencer 100, encoder/decoder 1104, motor control 168, servo control circuit 180 and a buffer memory controller 210. As mentioned, these circuits are preferably, although not necessarily, embodied within a single VLSI application specific CMOS circuit, as suggested by the single block for these circuits in FIG. 6. An address bus 204 extends from the microcontroller interface 202 to a program memory 206. Certain of the address bit positions for addressing the program memory 206 are generated and put out directly to the program memory 206 by the microcontroller 196 over an address bus 208.

The buffer memory controller 210 generates buffer addresses and puts them out over a bus 212 to a buffer memory 214 which may preferably be configured as a data cache. In the present example the buffer memory 214 is arranged as an 8 kilobit by 8 bit array (64 kilobit). Data blocks are transferred to and from the FIFO register 108 within the sequencer 100 and the buffer memory 214 via a buffer data bus 216. This bus 216 also extends to an interface control circuit 218 which receives data blocks and command values via an interface bus 220 connected to a host system and stores the values and blocks in the memory 214, and which returns status values and data blocks from the memory 214 via the interface bus 220 to the host. The interface circuit may implement industry standard host-subsystem bus level interfaces, such as the SCSI interface standard, or it may implement the IDE interface standard (IBM AT bus), as is conventionally known in the art. For example, an NCR type 5380 SCSI interface controller is a suitable interface control circuit 218 for implementing the SCSI bus convention standard.

A direct memory access path exists between the microcontroller 196 and the buffer memory 214 via the micro interface 202 and the buffer control 210. With this path, it is practical for the microcontroller to access particular byte locations of the buffer memory 214 in order to withdraw an erroneous byte from an error location, XOR the erroneous byte with a correction value, and write the correction value to the error location, in order to implement an on-the-fly error correction method of the present invention.

As noted repeatedly hereinabove, the disk drive 160 is a presently preferred subsystem or environment for utilization of the on-the-fly error correction techniques of the present invention. As will be appreciated by those skilled in the art, many of the low level repetitive syndrome generating and checking tasks are carried out in the syndrome generator hardware shown in FIG. 4 and described in conjunction therewith. The high level task of calculating error correction values is carried out as needed by the microcontroller 196 in accordance with the error correction service routine program accompanying this specification by way of microfiche disclosure incorporated herein by reference.

Preferably although not necessarily, the microcontroller 196 is a single monolithic microcontroller such as the NEC 78322, or equivalent, operating in a two-phase time divided arrangement per servo sector wherein a first time interval upon the arrival of each servo sector is devoted to servo control operations for head positioning, with a second and following time interval devoted to other tasks, including supervision of data block transfers and error correction operations, for example. An overview of this form of disk drive architecture is provided in commonly assigned U.S. Pat. No. 4,669,004 to Moon et al., the disclosure of which is hereby incorporated by reference. A hierarchical system for managing the tasks performed by the microcontroller 196 during the second and following time interval is disclosed in commonly assigned U.S. patent application Ser. No. 07/192,353, filed on May 10, 1988, now U.S. Pat. No. 5,005,089, the disclosure of which is hereby incorporated by reference. The error correction functions of the exemplary microcontroller 196 could readily be carried out by one or more microcontrollers in a multiple microcontroller architecture, with improved real time performance, but at higher cost of implementation.

In overview, the error correction process for a data-read-from-disk operation includes during the data reading back process (and after each data block has had syndrome bytes and cross check bytes appended thereto during a previous data writing operation) the following steps:

1. Preset the shift registers of the syndrome generator 10 to a predetermined known state, which may be a recurrent pattern of arbitrarily ordered ones and zeros.

2. Generate syndrome remainder bytes and cross check syndrome remainder bytes for a data block (data sector) from the stream of data bytes read from the disk by passing those bytes through the syndrome generator 10.

3. Check to see if the remainder bytes for each interleave are equal to zero as the last byte interleave is clocked into the syndrome generator 10.

a. If the remainder bytes for each interleave are equal to zero, wait until the next block or sector, as no correction is required.

b. If one or more remainder bytes for an interleave are not equal to zero and if the syndrome latch is available to hold the syndrome, proceed to step 4.

c. If the remainder bytes are not equal to zero and if the syndrome latch is not presently available to hold the syndrome (meaning that remainder bytes from the last data block remains latched therein during an already-commenced on-the-fly error correction operation), stop data flow; on-the-fly error correction cannot continue to be performed.

4. Latch the remainder bytes for each interleave into the syndrome latch 68. These remainder bytes have the form R0, R1, R2 and R3 (for each interleave) wherein:

$$R(x) = R3x^3 + R2x^2 + R1x + R0 \tag{30}$$

After the remainder bytes Ri for a present data block are latched into the syndrome latch 68, the syndrome generator 10 then continues to decode remainder bytes for the next data block. A pair of non-zero remainder bytes from adjacent data blocks will effectively shut down the presently described implementation of on-the-fly error correction process as the microcontroller 196 presently employed lacks sufficient random access memory space to receive and store remainder bytes from successive data blocks on-the-fly. However, there is no reason that increased random access memory space may be used to hold these bytes and thereby enable continuing on-the-fly error correction for multiple successive data blocks. The potential for shut-down is also dependent upon the time required by the microcontroller 196 to correct the first error and test the correction with the cross-check syndrome. A further limitation resides in the size of the block buffer memory 214. Also, the syndrome generator 10 may be modified by provision of additional circuitry for directly calculating and putting out partial syndrome bytes to the microcontroller 196 via the syndrome latch in order to speed up error correction.

5. Cause the microcontroller 196 to call and execute the error correction service routine and begins executing that routine. As is known by those skilled in the art, this step may be implemented through interrupt or polling techniques.

6. Transfer remainder bytes from the remainder latch 68 to the microcontroller 196 on an as needed basis during execution of the error correction algorithm. The firmware then converts remainder bytes R(x) to partial syndrome bytes S(x) if any of the remainder bytes are unequal to zero, in accordance with:

$$Si = \frac{R(x) \bmod (x + alpha^{i+126})}{alpha^{(i+126)*4}} \tag{5c}$$

where i=0, 1, 2 and 3
[wherein the plus symbol in the exponent indicates arithmetic addition, rather than an exclusive OR operation] so that partial syndromes S0, S1, S2 and S3 are obtained. We must go through this conversion process because the syndrome generator circuit 10 is also used during data readback to provide the remainder bytes Ri in order to more optimally minimize the amount of required hardware.

7. For each interleave, convert the remainder bytes to partial syndrome bytes within an interleave of three:

$S0 = $ Data modulo $(X + alpha^{126})$
$S1 = $ Data modulo $(X + alpha^{127})$
$S2 = $ Data modulo $(X + alpha^{128})$
$S3 = $ Data modulo $(X + alpha^{129})$.

a. On-The-Fly Single Burst Error Correction. For on-the-fly single-burst error correction, let L1 equal the error location and e1 equal the error value.
  (1) If $(S0=0)$, or $(S1=0)$ or $(S2=0)$ or $(S3=0)$, then go to the double burst error correction algorithm.
  (2) If $(S1/S0=S2/S1=S3/S2)$ then continue, otherwise go to the double burst error correction algorithm.
  (3) Perform: $L1 = \text{Log}[S1/S0]$ and $e1 = S1 (S0/S1)^{127}$
  (4) If L1 is outside of a predetermined range, (i.e. 0–175 for interleave 1; 0–174 for interleaves 2 and 3), then go to double burst correction, else proceed to step 8 below.

b. Double Burst Error Correction. For double burst error correction, let L1 and L2 equal the error locations; and, let e1 and e2 equal the error values at the respective locations.
  (1) Calculate $\phi 1$ and $\phi 2$ in accordance with equations (16) and (17) above.
  (2) If the denominator or numerator of $\phi 1$ or $\phi 2$ is equal to zero, then flag an uncorrectable error to the host.
  (3) Find the roots of the quadratic equation (18) given above and output the resultant X1 and X2 values.
  (4) If $\phi(x)$ has no solution, flag an uncorrectable error to the host.
  (5) Calculate error locations L1 and L2 in accordance with equations (19) and (20) above. If either L1 or L2 has a value located beyond the predetermined permissible range of values, then flag an uncorrectable error to the host.
  (6) Calculate error values e1 and e2 in accordance with the equations (21) and (22) given above. If either e1 or e2 equal zero, then flag an uncorrectable error to the host, else proceed to step 8 below.

8. The microcontroller 196 then computes the effect of the changed byte upon the cross check partial syndrome and saves this computed value and repeats this process for each of the other two interleaves of the data block.

9. If the correction passes the cross check checking step 8, the microcontroller 196 then corrects the error using its DMA channel to the buffer memory 214 leading through the micro interface 202 and buffer control 210 by withdrawing the erroneous byte from the error location within the block, XORing the erroneous byte with a correction value to yield a corrected byte, and writing the corrected byte back to the error location.

10. Taking the error correction into account:
  a. If the cross check partial syndrome is equal to zero, the error correction process is determined to be within the probability of miscorrection and is therefore completed; the syndrome latch 68 is released, and the data block in the memory buffer 214 containing the corrected error is then released for transfer to the host.
  b. If the cross check partial syndrome is unequal to zero, on-the-fly error correction is stopped, and step 11 is performed.

11. One or more retries are then undertaken, until a correction is achieved, or the error is determined to be much larger than originally contemplated, in which case an uncorrectable error is flagged to the host. When a retry is commanded by programming at the microcontroller 196, the retry is performed by the microcontroller off line in the sense that this process is carried out after data flow has been interrupted. An error message may be generated and sent to the host, and the retry process may continue for e.g. eight retries, as is standard at the interface.

Thus, on-the-fly ECC occurs essentially in the background as a part of the read channel process by which data is transferred from the disk to the host in a manner transparent to the host machine. If the transparent on-the-fly ECC methods described herein are unable to correct the error or errors to a user-acceptable confidence level, then more conventional error recovery activities and procedures may occur in the foreground at the interface with the host, as per the conventional SCSI error correction standard, for example.

Error detection processes for checking the ID fields are carried out entirely within the sequencer 100, so that if an error is detected in the ID field, repeats are made until either the sector is declared to be inaccessible, or it is accessed.

With reference to the Microfiche Appendix accompanying the application for this patent, a few changes made at the time of filing of the application resulting in this Patent should be noted in the disclosure thereof: the code at line 1171 was deleted and reinserted at line 1166; the code at line 1183 was deleted and reinserted at line 1177; and, the code at line 1181 was deleted.

Having thus described an embodiment of the invention, it will now be appreciated that the objects of the invention have been fully achieved, and it will be understood by those skilled in the art that many changes in construction and widely varying embodiments and applications of the invention will suggest themselves without departing from the spirit and scope of the invention. The disclosures and the description herein are purely illustrative and are not intended to be in any sense limiting.

What is claimed is:

1. In a data handling system comprising a first data source apparatus for sending and receiving a sequence of data blocks, a block buffer means for temporary storage of sequences of data blocks, a second data source apparatus for sending and receiving a sequence of code blocks wherein each code block includes user bytes contained in a corresponding data block and additionally contains error correction syndrome bytes related to the user bytes, an interface circuit between the first data source apparatus and the block buffer means, an encoder/sequencer between the block buffer means and the second data source apparatus for encoding the data blocks in code blocks and for sequencing the code blocks to a data destination apparatus, and a programmed microcontroller for supervising block transfer operations of the interface circuit and the encoder/sequencer, Reed-Solomon error correction apparatus for performing on-the-fly error correction upon a data block within the sequence, the error correction apparatus further including:

Galois Field syndrome generator and remainder recovery circuit means connected to the encoder/sequencer to receive and process each code block from the second data source apparatus for recovering error correction remainder bytes for said code block while the user bytes thereof are transferred into the block buffer means as said data block, said error correction remainder bytes being related to the syndrome bytes appended to the code block, the generator and remainder recovery circuit means including comparing means for comparing predetermined ones of said recovered error correction remainder bytes with a nominal value, and latch means for latching recovered plural error correction remainder bytes in response to a non-equivalence as determined by said comparing means, thereby freeing the generator and remainder recovery circuit means for recovering error correction remainder bytes from a next one of the code blocks of the sequence without significant interruption of data block flow in the system, the microcontroller being responsive to a said non-equivalence for calling and executing an error correction service program routine and thereupon selectively obtaining the recovered error correction remainder bytes from the latch means, and including calculation means responsive to the selectively obtained error correction remainder bytes for performing an error correction calculation by calculating at least one error location and a corresponding error value and for generating corrected data to replace erroneous data of the block, and further including direct access means for directly accessing the block buffer means for substituting the corrected data for the erroneous data before the block is transferred by the interface circuit to the first data source apparatus.

2. The apparatus set forth in claim 1 wherein the generator and recovery circuit means further comprises Reed-Solomon cross check syndrome generator means for recovering cross checking syndrome information appended to each data block by the encoder/sequencer and for storing said recovered cross checking syndrome information in said latch means, and wherein the microcontroller means upon executing the error correction service program routine further verifies the accuracy of an error correction calculation with the recovered cross checking syndrome information.

3. The apparatus set forth in claim 2 wherein the recovered cross checking information is related to Reed-Solomon cross check syndrome information in accordance with a polynomial, $G(s) = x^2 + a$, where a is unequal to one.

4. The apparatus set forth in claim 3 wherein the Reed-Solomon cross check syndrome information is in accordance with a polynomial;

$$G(x) = x^2 + alpha^1 \text{ where alpha}^1 \text{ is unequal to one.}$$

5. The apparatus set forth in claim 1 wherein each said code block includes a data identification field, and the generator and recovery circuit means further comprises error detection means for recovering and checking error detection syndrome information previously appended to said data identification field of each code block.

6. The apparatus set forth in claim 5, wherein the error detection means detects an error in said data ID field having error detection information appended thereto in accordance with a two byte syndrome generated in accordance with a polynomial:

$$^GEDC2(x) = x^2 + ax + b, \text{ where b is a constant which is unequal to one.}$$

7. The apparatus set forth in claim 6 wherein the error detection means detects an error in said data ID field having error detection information appended thereto in accordance with the two byte syndrome generated in accordance with a polynomial:

$$^GEDC2(x) = x^2 + x + alpha^{18}.$$

8. The apparatus set forth in claim 6 wherein the error detection means detects an error in said data ID field having error detection information appended thereto in accordance with a two byte syndrome generated in accordance with a polynomial:

$$^GEDC2(x) = x^2 + alpha^{81}.x + alpha^{81}.$$

9. The apparatus set forth in claim 5, wherein the error detection means detects an error in a said data ID field having error detection information appended thereto in accordance with a three bytes syndrome generated in accordance with a polynomial:

$$^GEDC3(x) = x^3 + ax^2 + bx + c.$$

10. The apparatus set forth in claim 9 wherein the error detection means detects an error in said data ID field having error detection information appended thereto in accordance with a three byte syndrome generated in accordance with a polynomial:

$$^GEDC3(x) = x^3 + alpha^{87}.x^2 + alpha^{87}.x + 1.$$

11. The apparatus set forth in claim 9 wherein the error detection means detects an error in said data ID field having error detection information appended thereto in accordance with a three byte syndrome generated in accordance with a polynomial:

$$^GEDC3(x) = x^3 + alpha^{81}.x^2 + alpha^{87}.x + alpha^{18}.$$

12. The apparatus set forth in claim 5 wherein the Galois Field syndrome generator and remainder recovery circuit means calculates error correction coding syndrome information in accordance with a Galois field ($2^8$) generated by a field generator polynomial having the form $x^8 + x^4 + x^3 + x^2 + 1$ and wherein the first term of the field is $x^5 + x^3 + x + 1$ (which is 00101011 binary), each error correction syndrome being of the form $G(x) = x^4 + (alpha^{18}).x^3 + (alpha^{87}).x^2 + (alpha^{18}).x^1 + 1$.

13. The apparatus set forth in claim 12 wherein the error detection means generates a two byte syndrome in accordance with a polynomial:

$$^GEDC2(x) = x^2 + ax + b, \text{ where b is unequal to one.}$$

14. The apparatus set forth in claim 13 wherein the error detection means generates a two byte syndrome in accordance with a polynomial:

$$^GEDC2(x) = x^2 + x + alpha^{18}.$$

15. The apparatus set forth in claim 13 wherein the error detection means generates a two byte syndrome in accordance with a polynomial:

$$^GEDC2(x) = x^2 + alpha^{81}.x + alpha^{81}.$$

16. The apparatus set forth in claim 12 wherein the error detection means generates a three byte syndrome in accordance with a polynomial:

$$G_{EDC3}(x) = x^3 + ax^2 + bx + c.$$

17. The apparatus set forth in claim 16 wherein the error detection means generates a three byte syndrome in accordance with a polynomial:

$$G_{EDC3}(x) = x^3 + alpha^{87}.x^2 + alpha^{87}.x + 1.$$

18. The apparatus set forth in claim 16 wherein the error detection means generates a three byte syndrome in accordance with a polynomial:

$$G_{EDC3}(x) = x^3 + alpha^{81}.x^2 + alpha^{87}.x + alpha^{18}.$$

19. The apparatus set forth in claim 1 wherein the generator and recovery circuit means generates error correction coding syndrome information in accordance with a Galois field ($2^8$) generated by a field generator polynomial having the form $x^8 + x^4 + x^3 + x^2 + 1$ and wherein the first term of the field is $X^5 + x^3 + x + 1$ (which is 00101011 binary), each error correction syndrome polynomial being of the form $G(x) = x^4 + (alpha^{18}).x^3 + (alpha^{87}).x^2 + (alpha^{18}).x^1 + 1$.

20. The apparatus set forth in claim 19 wherein the generator and recovery circuit means further comprises Reed-Solomon cross check syndrome generator means for recovering cross checking syndrome information appended to each code block and wherein said latch means also stores recovered cross checking syndrome information, and further wherein the microcontroller means verifies the accuracy of an error correction calculation with the recovered cross checking syndrome information, the Reed-Solomon cross check syndrome generator means for calculating cross checking syndrome information in accordance with a polynomial;

$G(x) = x^2 + b$, where b is unequal to one.

21. The apparatus set forth in claim 20 wherein the cross check syndrome generator means calculates cross checking syndrome information in accordance with a polynomial;

$$G(x) = x^2 + alpha^1.$$

22. The apparatus set forth in claim 20 wherein the cross check syndrome generator means comprises

- an input connected to the encoder/sequencer for receiving an incoming block as a clocked data stream of serial bytes,
- first summing junction means for summing each byte of the clocked data stream with a feedback byte to produce a sum byte,
- first multiplier means for multiplying the sum byte by alpha$^1$ to yield a first product byte,
- first clocked latch stage means connected to the first multiplier means for storing the first product byte during a first byte clock period and for storing subsequent product bytes during subsequent byte clock periods,
- second clocked latch stage means connected to the first clocked latch stage means for storing the first product byte during a second byte clock period, the second clocked latch stage means for feeding back the first product byte during the second byte clock period as the feedback byte to the summing junction.

23. Reed-Solomon error correction apparatus for performing on-the-fly error correction within a disk drive storage subsystem including at least one rotating data storage disk, at least one data transducer head which is controllably positioned for writing data to the disk and for reading data from the disk, head positioner means for positioning the data transducer head, a read/write data channel, sequencer means for encoding blocks of data into code blocks and for sequencing the code blocks from a block buffer memory means serially onto the disk via the read/write channel and data transducer head during data writing operations and for decoding and sequencing serial data code blocks into data blocks for delivery to the block buffer memory means during data reading operations, the block buffer memory means being capable of storing a plurality of contiguous ones of said data blocks, an interface controller for transferring data blocks between a host computer and the block buffer memory means, and programmed microprocessor means for supervising the head positioner means and for controlling operations of the data sequencer means, the block buffer memory means and the interface controller, the error correction apparatus further including:

- Galois Field syndrome generator and remainder recovery circuit means connected to the sequencer means to receive and process each data block for generating plural partial error correction syndrome bytes for said data block, said bytes being appended to the data block to form a corresponding code block to be written to the disk during data writing operations, said generator and recovery circuit means for detecting errors by recovering plural error correction remainder bytes from each code block read from the disk during data reading operations,
- the generator and recovery circuit means including comparing means for comparing predetermined ones of said regenerated plural error correction remainder bytes with a nominal value, and latch means for latching recovered error correction remainder bytes in response to a non-equivalence as determined by said comparing means,
- the programmed microprocessor means being responsive to a said non-equivalence for calling and executing an error correction service program routine and thereupon selectively obtaining recovered error correction remainder bytes from the latch means, and including calculation means for calculating at least one error location and at least one error value from the obtained regenerated error correction remainder bytes, the calculation means for generating a corrected value to replace the error value, and the microprocessor means controlling direct access means for directly accessing the block buffer memory means for substituting the corrected value for the error value of a data block stored therein including the error location before the data block is transferred by the interface controller to the host computer and without significantly stopping flow of data blocks to the host computer.

24. The apparatus set forth in claim 23 wherein the generator and recovery circuit means further comprises Reed-Solomon cross check syndrome generator means for calculating and appending cross checking syndrome information to the code block during data writing, and wherein the cross check syndrome generator means recovers cross checking remainder bytes from each code block read from the disk, and wherein the latch means additionally latches the recovered cross check remainder bytes, and further wherein the error correction service program routine causes the microprocessor means to verify the accuracy of a proposed error correction in relation to the recovered cross check remainder bytes prior to substitution of the corrected value for the error value within the data block.

25. The apparatus set forth in claim 23 wherein each said code block further includes a data identification (ID) field therein, and wherein the generator and recovery circuit means further comprises error detection means for recovering and checking error detection remainder bytes of the data ID field of each said code block.

26. The apparatus set forth in claim 23 wherein the generator and recovery circuit means error correction coding syndrome information in accordance with a Galois field ($2^8$) generated by a field generator polynomial having the form $x^8+x^4+x^3+x^2+1$ and wherein the first term of the field is $x^5+x^3+x+1$ (which is 00101011 binary), each error correction syndrome being in accordance with a polynomial:

$$G(x)=x^4+(alpha^{18}).x^3+(alpha^{87}).x^2+(alpha^{18}).x+1.$$

27. The apparatus set forth in claim 26 wherein the generator and recovery circuit means further comprises Reed-Solomon cross check syndrome generator means for calculating checking syndrome information in accordance with a polynomial:

$G(x)=x^2+a$, where a is unequal to one.

28. The apparatus set forth in claim 27 wherein the cross check syndrome generator means calculates checking syndrome information in accordance with a polynomial:

$G(x)=x^2+alpha^1$ where $alpha^1$ is unequal to one.

29. The apparatus set forth in claim 26 wherein the generator and recovery circuit means further comprises error detection means for detecting an error in a data identification field of each said block by generating a two byte syndrome in accordance with a polynomial:

$GEDC2(x)=x^2+ax+b$, where b is unequal to one.

30. The apparatus set forth in claim 29 wherein the error detection means generates a two byte syndrome in accordance with a polynomial:

$$GEDC2(x)=x^2+x+alpha^{18}.$$

31. The apparatus set forth in claim 29 wherein the generator and recovery circuit means further comprises error detection means for detecting an error in a data ID field of each said code block by generating a two byte syndrome in accordance with a polynomial:

$$GEDC2(x)=x^2+alpha^{81}.x+alpha^{81}.$$

32. The apparatus set forth in claim 26 wherein the generator and recovery circuit means further comprises error detection means for detecting an error in a data identification field of each said code block by generating a three byte syndrome in accordance with a polynomial:

$$GEDC3(x)=x^3+ax^2+bx+c.$$

33. The apparatus set forth in claim 32 wherein the error detection means generates a three byte syndrome in accordance with a polynomial:

$$GEDC3(x)=x^3+alpha^{87}.x^2+alpha^{87}.x+1.$$

34. The apparatus set forth in claim 32 wherein the error detection means generates a three byte syndrome in accordance with a polynomial:

$$GEDC3(x)=x^3+alpha^{81}.x^2+alpha^{87}.x+alpha^{18}.$$

35. The apparatus set forth in claim 23 wherein the programmed microprocessor means comprises a single microprocessor.

36. The apparatus set forth in claim 35 wherein the programmed microprocessor devices its functional activities between head position control and data flow supervision including execution of said error correction service program routine.

37. The apparatus set forth in claim 23 further comprising a head positioner means for positioning said data transducer head among a multiplicity of concentric data tracks, and a servo control loop for controlling the head positioner, the servo control loop further including the programmed microprocessor means.

38. The apparatus set forth in claim 37 wherein the disk includes prerecorded servo information for the servo control loop embedded within the multiplicity of concentric data tracks, and wherein the servo control loop includes servo data recovery means for recovering the embedded servo information read by the data transducer head.

39. The apparatus set forth in claim 37 wherein the multiplicity of data tracks are arranged as a plurality of contiguous zones, each said zone having a data transfer rate determined in relation to radial offset of the said zone from an axis of rotation of the disk, and wherein the sequencer means sequences data blocks from the disk to the block buffer memory means at a first predetermined data transfer rate fixed in relation to radial offset of the said zone from an axis of rotation of the disk, and further wherein the interface controller means controls transfer of data blocks from the block buffer memory means to the host computer at a second data transfer rate.

40. The apparatus set forth in claim 23 wherein the sequencer means encodes the data blocks into run length limited code values incident to generation of code blocks during data writing operations, and wherein the sequencer means decodes the code blocks from run length limited code values into unencoded data blocks during data reading operations.

41. The apparatus set forth in claim 40 wherein the sequencer encodes the data blocks, and decodes the code blocks, in accordance with a 1,7 run length limited code.

42. An on-the-fly error correction apparatus in a data storage system for a host computer, the system including an interface to the host computer, an interface controller for controlling data block transfers of the interface, a data block buffer memory for temporarily storing a string of data blocks, a magnetic data storage medium for storing sequences of code blocks, a magnetic data transducer for writing code blocks to the medium, a read/write channel connected to the magnetic data transducer for processing code blocks read from the medium by the data transducer, a data sequencer connected to the data block buffer memory and to the read/write channel for converting data blocks into code blocks during data writing, and for converting code blocks to data blocks during data reading, a block buffer memory controller storage operations in the data block buffer memory, and a programmed microcontroller for controlling the interface controller, the data sequencer, and the block buffer memory controller, and having a direct access path to the data block buffer memory, the on-the-fly error correction apparatus comprising:

Galois Field syndrome generator and remainder recovery circuit means connected to the sequencer means to receive and process each data block for generating plural partial error correction syndrome bytes for said data block, said bytes being appended to the data block incident to formation of a corresponding code block to be written to the disk during data writing, said generator and recovery circuit means for detecting errors by recovering plural error correction remainder bytes from each block read from the disk during data reading, the generator and remainder recovery circuit means including comparing means for comparing predetermined ones of said regenerated plural error correction remainder bytes with a nominal value, the generator and remainder recovery circuit means further including cross check generator and recovery circuit means for calculating and appending cross checking syndrome information to the code block during data writing, and for recovering cross checking remainder bytes from each code block read from the disk, the generator and remainder recovery circuit also including latch means for latching recovered error correction remainder bytes and recovered cross check remainder bytes in response to a non-equivalence as determined by said comparing means, the programmed microcontroller being responsive to a said non-equivalence for calling and executing an error correction service program routine and thereupon selectively obtaining recovered error correction remainder bytes and the recovered cross check remainder bytes from the latch means, and including calculation means for calculating at least one error location and at least one error value from the recovered error correction remainder bytes, the calculation means for generating a corrected value to replace the error value, the microcontroller thereupon verifying accuracy of the corrected value in relation to the recovered cross check remainder bytes, and the microcontroller thereupon controlling the block buffer memory controller and substituting the corrected value for the error value of a data block stored therein including the error location before the data block is transferred by the interface controller to the host computer and without significantly stopping flow of data blocks to the host computer.

43. The apparatus set forth in claim 42 wherein the generator and recovery circuit means generates Reed Solomon error correction coding syndrome information in accordance with a Galois field ($2^8$) generated by a field generator polynomial having the form $x^8+x^4+x^3+x^2+1$ and wherein the first term of the field is $x^5+x^3+x+1$ (which is 00101011 binary), each error correction syndrome being in accordance with a polynomial:

$$G(x)=x^4+(alpha^{18}).x^3+(alpha^{87}).x^2+(alpha^{18}).x+1;$$

and wherein the cross check generator and recovery means generates Reed Solomon cross checking syndrome information in accordance with a polynomial:

$$G(x)=x^2+alpha^1.$$

* * * * *